United States Patent
Hayashi et al.

(10) Patent No.: US 8,124,568 B2
(45) Date of Patent: Feb. 28, 2012

(54) OXIDE SUPERCONDUCTOR AND METHOD OF FABRICATING SAME

(75) Inventors: Mariko Hayashi, Tokyo (JP); Takeshi Araki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 788 days.

(21) Appl. No.: 12/243,087

(22) Filed: Oct. 1, 2008

(65) Prior Publication Data

US 2009/0247413 A1 Oct. 1, 2009

(30) Foreign Application Priority Data

Mar. 27, 2008 (JP) ................................. 2008-082683

(51) Int. Cl.
*H01L 39/12* (2006.01)
*H01B 12/00* (2006.01)

(52) U.S. Cl. ........ 505/234; 505/123; 505/237; 505/238; 505/461; 505/470; 428/469; 428/698; 428/701; 174/125.1; 427/62

(58) Field of Classification Search .............. 505/123, 505/234, 237–238, 470, 500; 428/469, 472, 428/698, 701; 427/62, 126.3; 174/125.1
See application file for complete search history.

(56) References Cited

U.S. PATENT DOCUMENTS

| 6,172,009 | B1 | 1/2001 | Smith et al. | |
|---|---|---|---|---|
| 6,332,967 | B1 * | 12/2001 | Bhattacharya | 205/51 |
| 6,610,428 | B2 | 8/2003 | Smith et al. | |
| 6,610,632 | B2 * | 8/2003 | Honjo et al. | 505/237 |
| 2002/0182451 | A1 * | 12/2002 | Smith et al. | 428/699 |
| 2006/0153969 | A1 * | 7/2006 | Araki et al. | 427/62 |
| 2008/0139393 | A1 * | 6/2008 | Araki | 505/123 |

FOREIGN PATENT DOCUMENTS

| JP | 2002-505032 | 2/2002 |
|---|---|---|
| JP | 2006-324620 | 11/2006 |
| WO | WO 98/58415 | 12/1998 |

OTHER PUBLICATIONS

Solovyov, et al., "Growth rate limiting mechanisms of $YBa_2Cu_3O_7$ films manufactured by ex situ processing", Physica C, vol. 353, pp. 14-22, (2001).

* cited by examiner

*Primary Examiner* — Stanley Silverman
*Assistant Examiner* — Kallambella Vijayakumar
(74) *Attorney, Agent, or Firm* — Finnegan, Henderson, Farabow, Garrett & Dunner, L.L.P.

(57) ABSTRACT

An oxide superconductor with superconduction properties being improved by effectively introducing a pinning center thereinto and its fabrication method are disclosed. The superconductor has a high-crystallinity oxide superconductor film which is formed on a substrate with a <001> direction of crystal grain being oriented almost perpendicularly to the substrate and with (100) planes of neighboring crystal grains being oriented to form an oblique angle ranging from 0 to 4 degrees or 86 to 90 degrees. The film has a multilayer structure including a plurality of high-density magnetic field trap layers stacked in almost parallel to the substrate and a low-density magnetic field trap layer sandwiched therebetween. An average grain boundary width of the high-density trap layers in a cross-section horizontal to the substrate is 80 nm or less. The width is less than an average grain boundary width of the low-density trap layer in its cross-section horizontal to the substrate.

7 Claims, 10 Drawing Sheets

F5b      F5c      F5d      F5e

OXIDE SUPERCONDUCTOR AND METHOD OF FABRICATING SAME

CROSS-REFERENCE TO RELATED APPLICATION

This application is based upon and claims priority to Japanese Patent Application No. 2008-082683, filed Mar. 27, 2008, the entire contents of which are incorporated herein by reference.

FIELD OF THE INVENTION

The present invention relates generally to an oxide superconductor adaptable for use in various applications including, but not limited to, lengthy electrical wires, superconducting coils, superconduction magnets, magnetic resonance imaging (MRI) systems, magnetic levitation or "maglev" trains, and superconductor magnetic energy storage (SMES) devices. This invention also relates to a method of making the oxide superconductor.

BACKGROUND OF THE INVENTION

In recent years, high critical current oxide superconducting materials are under diligent investigation for practical implementation. Such oxide superconductors hold great promise for application to long electrical wires, nuclear fusion reactors, maglev trains, accelerators, MRI tools, SMES devices, microwave filters, etc. In some fields of technology, practical applications have already been made until today. The oxide superconductors typically include bismuth-based, yttrium-based and thallium-based ones. Especially, the yttrium-based superconductor attracts the attention of researchers and engineers because this material offers the highest possible properties in magnetic fields at the liquid nitrogen temperature and, therefore, is the only one that is employable for linear motor cars with the aid of a liquid nitrogen cooling device.

This yttrium-based (Y-based) superconductor has the so-called perovskite structure, which is represented by a composition formula of $YBa_2Cu_3O_{7-x}$. It is known that those materials with the yttrium (Y) of $YBa_2Cu_3O_{7-x}$ being replaced by a lanthanoid-based rare earth element and mixtures of such materials also exhibit superconductivity. Known examples of a fabrication method of these superconductor materials are a pulse laser deposition (PLD) method, liquid-phase epitaxy (LPE) method, electron beam (EB) method and metal organic deposition (MOD) method.

Superconductor fabrication methodology is typically categorized in two major approaches: an in-situ process and ex-situ process. The in-situ process is the method that performs both deposition of a metal required for making a superconductor and formation of a superconductor through oxidation at a time. The ex-situ process is the one that performs deposition of a material which is the base or starting material of a superconductor and thermal processing for forming the superconductor in a way independent of each other. Consequently, only in the ex-situ process, a precursor exists which is a pre-stage material prior to firing process. In cases where such precursor is obtained by firing, this is called the calcined or "precursor" film.

It is the in-situ process that has attracted attention in early stage of the development of superconductors because this process was thought to be a promising superconductor fabrication technique in light of its expected advantages: less process step number, and cost reducibility. However, later studies have revealed the fact that the in-situ process suffers from difficulties in obtaining excellent superconductors as it strictly requires that all of the film fabrication conditions must be set up together at a time. The ex-situ process, on the other hand, was first considered to have the risk of manufacturing cost increase. However, after development of a non-vacuum process, such as the metal-organic deposition (MOD) method or trifluoroacetate-metalorganic deposition (TFA-MOD) method, it became possible to attain noticeable manufacturing cost reduction. In addition, as thermal processing is readily controllable by use of a process with the heat treatments being performed at two separate steps, high properties are efficiently obtainable with excellent reproducibility. Accordingly, the ex-situ process now becomes a major process for fabricating yttrium (Y)-based superconductors.

Currently known ex-situ processes include EB, MOD and TFA-MOD methods. The EB method is a process having the steps of using an electron beam to deposit a precursor made of a chosen metal or else in a vacuum, and then applying thereto thermal processing or "firing" to thereby form a Y-based superconductor. Due to the presence of fluorine during firing process, it is predicted that crystal growth is performed while forming a quasi-liquid network as in TFA-MOD method. However, as this technique uses no carbon, any residual carbons do not exist in the resultant superconductor at all.

The MOD method has been long studied in other technical fields. Considerable efforts have been focused on the quest for reducing the amount of residual carbon that is harmful to Y-based superconductors. However, an effective residual carbon reduction technique is not found yet. To reduce the residual carbon, a need is felt to use a large-size electric furnace with good heat uniformity. The precursor of this technique is also called the precursor film in view of the fact that tentative or calcining process is done. This precursor is characterized in that it does not contain fluorine at all.

Regarding the TFA-MOD method, this is a derivative of the above-stated MOD method and has various features unique thereto. The TFA-MOD method is a technique using an organic matter, one feature of which lies in the use of a fluoride composition to thereby have a special mechanism capable of removing and excluding the carbon harmful to superconductor at the time of calcining process prior to firing process. Owing to this feature, the intended superconductor with enhanced properties is readily obtainable.

During firing process, the fluorine behaves to form a quasi-liquid phase network, which ensures that an atom-level oriented organization is formed by equilibrium chemical reaction with improved repeatability. Furthermore, the TFA-MOD method is a low-cost process that uses no vacuum during the steps of film fabrication, calcining process and firing process; so, this is soon intensively studied by many researchers in the world. Development of practically usable long wire materials is vigorously advanced—mainly, in Japan and USA. Today, it is reported in Japan that a 200 m-long electrical wire capable of obtaining a superconduction current or "supercurrent" as large as 200 A was manufactured in success.

While Y-based superconductor is in the way of reaching completion of the fabrication process thereof, its major applications considered are electrical coils to be used in large magnetic fields and wires to be used under relatively small magnetic fields created by Y-based superconductor. When a supercurrent flows in magnetic fields, it receives the so-called Lorentz force, resulting in electrical resistance taking place in the current. This leads to a decrease in critical current density Jc. As well known among those skilled in the art, magnetic fluxes that form a magnetic field cause superconduction properties to be impaired at every part if these magnetic fluxes are movable within supercurrent-obtainable regions. This would result in significant deterioration of superconductor wire characteristics to one-hundredth (1/100) or below as a whole.

It is the pinning center that suppresses such unwanted movement of magnetic fluxes leading to characteristics deterioration, thereby to improve the superconduction properties. By intentionally creating magnetic flux-passable non-superconductive regions, magnetic fluxes are prevented from moving into other superconductive portions, thus obtaining high properties of a superconducting wire in its entirety. In the case of foreign matter with no superconductivity being introduced as the pinning center, high superconductivity is practically obtainable in magnetic fields as a whole, although such portion becomes non-superconductor. For this reason, since the discovery of material with superconductivity, diligent and intensive studies have been continued to find the way of effectively introducing the pinning center into superconductor.

In recent years, several approaches are being vigorously studied to use PLD method to introduce, as the pinning center, a hetero-phase having a nano-size width, called the "nanorod." Using $BaZrO_3$ or $BaSnO_3$ or else, an ultrafine linear nanorod is introduced into inside of a superconductor. Then, by causing magnetic fluxes to pass through this nanorod, let it function as the pinning center to thereby prevent degradation of superconduction properties occurring due to magnetic fluxes at other portions. It has been reported that in nanorod-introduced superconductors, a supercurrent obtained is enhanceable up to a fivefold to tenfold in the presence of a strong magnetic field of about 5 webers per square meter (weber/$m^2$) or "teslas (T)," when compared to a superconductor with no nanorods introduced thereinto. A wire made of such nanorod-introduced superconductor is suitable for application to coils of the type creating a strong self magnetic field.

However, it is also known that when introducing a certain material with no supercurrent flowability, such as $BaZrO_3$, into $YBa_2Cu_3O_{7-x}$ superconductor to thereby form a film, followed by execution of pure oxygen anneal for converting the superconductor from a tetragonal crystal structure into an orthorhombic crystal structure, the resulting superconduction properties are badly affected due to unintentional material diffusion into adjacent or nearby superconductors. According to recent reports, this results not only in a decrease in critical current density Jc but also in a decrease in superconductivity transition temperature Tc. Thus, the nanorod-added superconductor is considered to be rather limited in industrial applicability: it is merely suitable for strong magnetic field coexistence applications, such as coils for example. On the contrary, in those applications with no needs for large magnetic fields, it seems better in some cases to employ the pinning center introduction scheme that does not rely upon the use of nanorods, in which the degradation of superconduction properties hardly occurs.

An electric power cable used for long-distance large-power transmission is thought to be one example of the applications that do not require the use of nanorods. This power cable is typically installed in such a manner that both-way wires are basically designed to make a pair for canceling out a magnetic field, although this depends on the voltage to be sent. These wires are spaced apart from each other by a predefined distance for high voltage power transmission. In this case, each wire experiences application of a magnetic field which is created by the other. Although this magnetic field is not as large as that of a coil, this magnetic field can badly affect a superconductor, resulting in a decrease in allowable value of a supercurrent flowing in the superconductor.

In addition, the power transmission cable is under the need for cooling down a long and large system associated therewith; so, it is difficult to use refrigerators in order to cool the system successfully. Only one approach to reaching this goal is to employ a cooling technique using liquid nitrogen with its boiling point of 77.4K. As Y-based superconductors are merely 90.7K in superconductivity transition temperature Tc, a decrease in Tc occurring due to the nanorod introduction leads to an increase in risk of quenching, which is caused by local heat elevation in practical implementations.

For power cables, it is desirable to use magnetic field characteristics-improving techniques which are without introduction of nanorods. One of these techniques is to improve magnetic field characteristics by appropriate design of a low-oblique angle crystal grain boundary. The low-angle grain boundary means, in most cases, that grain planes of a superconductor are coupled together while forming therebetween a small plane-direction bond angle of about four (4) degrees or less. It is known that if the oblique angle is kept less than or equal to 4 degrees, the resulting superconductor is less in damageability. It is also known that the grain boundary thereof functions as the pinning center.

This low-angle grain boundary introducing technique is different depending on a superconductor film fabrication process used. In the PLD method or else, it often depends on a film forming temperature, oxygen partial pressure, to-be-formed plume position, etc. Therefore, when reduction to practice, it is almost impossible to precisely control an ultrafine structure while at the same time increasing reproducibility, although rough control is attainable as a whole. In PLD method, a plume is formed by irradiation of a laser beam onto a target; so, as the target is trenched more deeply, the plume can change in shape, resulting in likewise changes in material deposition rate and crystal orientation degree, causing the reproducibility to decrease accordingly.

Regarding the low-angle grain boundary formation, recent studies have revealed that the use of TFA-MOD method is effective for forming the intended grain boundary. While various types of growth mechanisms using this technique have been proposed until today, a crystal grain or particle is formed by creation and growth of the nuclear or "core" of a superconducting grain according to a quasi-liquid phase network model. An oblique angle to be formed by neighboring planes thereof is as small as 0.4 degrees in average so that a pinning center-introduced structure is obtained, which avoids deterioration of superconduction properties.

The density of crystal grains is controllable by adjustment of nucleation frequency and grain growth rate. These are controllable by macro parameters, such as a firing process temperature and partial pressures of oxygen and water vapor. Thus, a high-characteristics superconductor is readily obtainable with increased reproducibility, as suggested by U.S. Pat. Nos. 6,172,009 and 6,610,428, for example. The process of fabricating a superconductor film using TFA-MOD method has its ability to form low-angle grain boundaries and thus is thought to be a promising technique adaptable for the manufacture of superconductors to be used under certain environments with co-presence of relatively weak magnetic fields approximate to a self magnetic field, such as power cables for example.

Unfortunately, prior known low-angle grain boundary forming techniques using the TFA-MOD method are faced with a problem as to deterioration of superconduction properties. This can be said because a once-created low-angle grain boundary readily disappears with growth since the bond angle stays as small as 0.4 degrees in average. Thus it is predicted that the properties decrease with an increase in film thickness—in reality, some reports revealed this fact.

It has traditionally been known that when a film of Y-based superconductor is formed on or above a single-crystalline substrate made of $LaAlO_3$, a great number of a/b-axis oriented crystal grains or particles with the c-axis (i.e., the <001> direction) being laterally laid down are formed, resulting in superconduction properties being degraded significantly. It has also been known that even for film fabrication on an intermediate layer made of $CeO_2$ with the c-axis being rarely apt to lay down, deterioration of properties under self magnetic fields takes place with an increase in thickness of a growing film. These causes are considered to be deeply related to the above-stated low-angle grain boundary reduction. Accordingly, it has been desired to provide a new and improved approach to improving the superconduction properties.

SUMMARY OF THE INVENTION

In accordance with one aspect of this invention, an oxide superconductor is provided, which includes a substrate, and an oxide superconductor film which is formed on the substrate to have high crystallinity, wherein a <001> direction of crystal grains is oriented substantially perpendicularly to the substrate and wherein (100) planes of neighboring ones of the crystal grains are oriented to form therebetween an oblique angle ranging from zero to four degrees or ranging from eighty-six to ninety degrees. The oxide superconductor film has a multilayer structure made up of a plurality of high-density magnetic field trap layers stacked in almost parallel to the substrate and a low-density magnetic field trap layer interposed between adjacent ones of the high-density magnetic field trap layers. An average grain boundary width of the high-density magnetic field trap layers in a cross-section horizontal to the substrate is less than or equal to eighty nanometers. The average grain boundary width is less than an average grain boundary width of the low-density magnetic field trap layer in its cross-section horizontal to the substrate.

In accordance with another aspect of the invention, an oxide superconductor fabrication method is provided, which includes the steps of preparing as a coating solution a fluorocarboxylate-methanol solution with a mixture of barium, copper and at least one metal which is selected from the group consisting of yttrium and lanthanoids with cerium, praseodymium, promethium and lutetium being excluded therefrom, dropping the coating solution on a substrate to form a gel film, applying calcining process to the gel film to thereby form a calcined film, and applying to the calcined film firing process with more than two changes in humidification amount during thermal processing and oxygen anneal to thereby convert the calcined film into an oxide film.

In accordance with a further aspect of the invention, an oxide superconductor fabrication method is provided, which includes the steps of preparing as a coating solution a fluorocarboxylate-methanol solution with a mixture of barium, copper and at least one metal which is selected from the group consisting of yttrium and lanthanoids with cerium, praseodymium, promethium and lutetium being excluded therefrom, laying the coating solution on a substrate to form a gel film, applying calcining process to the gel film to thereby form a calcined film, and applying to the calcined film firing process with more than two changes in gas flow rate during thermal processing and oxygen anneal to thereby convert the calcined film into an oxide film.

DETAILED DESCRIPTION OF THE EMBODIMENTS

Figure 1:
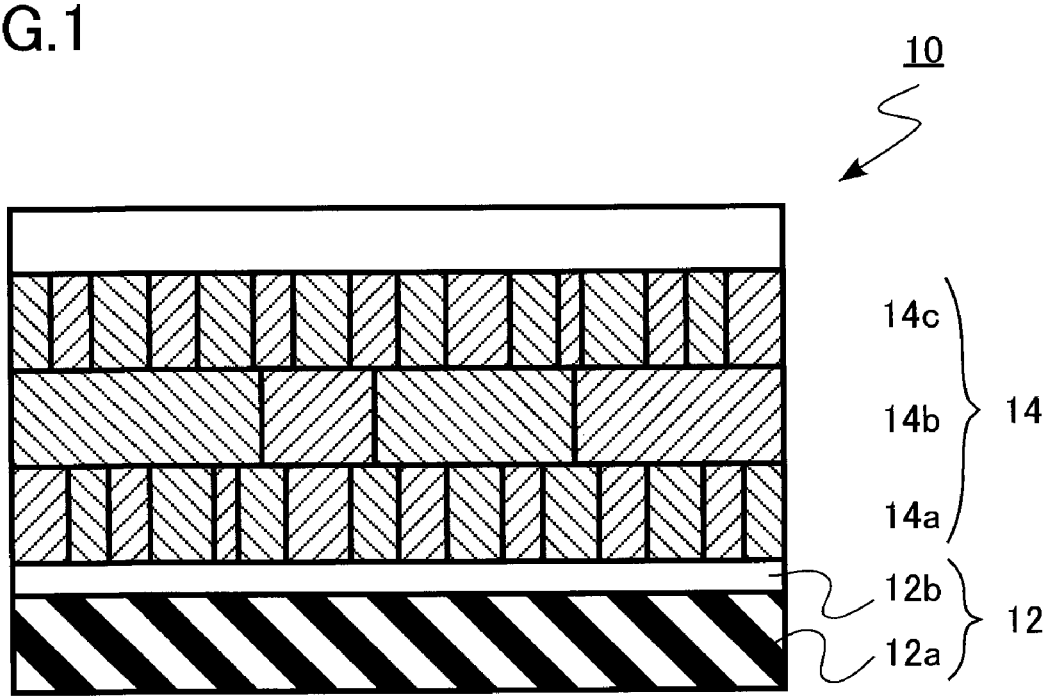
FIG. 1 is a diagram illustrating, in cross-section, an oxide superconductor structure in accordance with a first embodiment of this invention.

Embodiments of the present invention will be described with reference to the accompanying figures of the drawing below. It should be noted that in the description, the term "low oblique angle (low-angle) grain boundary" is used to mean the grain boundary that is formed by coupling of (100) planes—or bc crystal planes—or bonding of a (100) plane and a (010) plane—or ac plane—at a small oblique angle of four (4) degrees or less when a grain plane and another grain plane are coupled together. In other words, in the case of crystal grains having crystal axes substantially at right angles to each other, the term means that the (100) planes of neighboring crystal grains define therebetween an angle of inclination which falls within a range of from zero (0) to four (4) degrees or, alternatively, a range of from eighty-six (86) to ninety (90) degrees.

In addition, in the description, the term "grain boundary width" refers to the distance between a grain boundary and a grain boundary—more specifically, in the case of an ensemble of grains which is substantially a rectangular solid which is oriented with respect to a substrate surface, it means the distance between a couple of long sides of a rectangle when looking at from above the substrate. Additionally, in the description, a layer of those layers constituting an oxide superconductor film having a layer structure in parallel to the substrate, which layer is relatively high in density of low-angle grains each of which becomes the pinning center (i.e., narrow in low-angle grain width) is referred to as a high density magnetic field trap layer whereas another layer which is interposed between a couple of high density magnetic field trap layers and which is low in density of low-angle grain boundary (i.e., wide in low-angle grain boundary width) is called the low density magnetic field trap layer.

First Embodiment

An oxide superconductor structure in accordance with first embodiment of this invention includes a substrate, and an oxide superconductor film which is formed on the substrate to have high crystallinity with a <001> direction of crystal grains being oriented substantially perpendicularly to the substrate and with (100) planes of neighboring ones of the crystal grains being oriented to form therebetween an oblique angle ranging from zero to four degrees or ranging from eighty-six to ninety degrees. The oxide superconductor film has a multilayer structure made up of a plurality of high-density magnetic field trap layers stacked in almost parallel to the substrate and a low-density magnetic field trap layer which is interposed between adjacent ones of the high-density magnetic field trap layers. An average grain boundary width of the high-density magnetic field trap layers in a cross-section horizontal to the substrate is less than or equal to eighty nanometers. This average grain boundary width is less than an average grain boundary width of the low-density magnetic field trap layer in its cross-section horizontal to the substrate.

FIG. 1 illustrates, in cross-section, an oxide-based superconductor structure 10 in accordance with one embodiment of this invention. As shown herein, the oxide superconductor 10 is constituted from a substrate 12 and an oxide superconductor film 14 which is formed on the substrate 12 and which is high in crystallinity. The substrate 12 is made up of a metallic base material 12a and an oxide orientation intermediate layer 12b, which is provided for controlling orientation of the oxide superconductor film 14.

The metal base 12a is made, for example, of a nickel-cobalt-chromium (Ni—Co—Cr) alloy, also known as hastelloy-C, or a nickel-tungsten (Ni—W) alloy. The oxide orientation interlayer 12b is made of at least one kind of oxide which is selected from the group consisting essentially of $LaAlO_3$, $NdGaO_3$, $Al_2O_3$, $SrTiO_3$, $CeO_2$, Y-enriched $ZrO_2$, $Y_2O_3$, $Gd_2Zr_2O_7$, $BaZrO_3$ and $BaZnO_3$. The oxide orientation interlayer 12b is provided in order to facilitate c-axis orientation of crystal grains of the oxide superconductor film 14, although this layer may be eliminatable when the need arises.

When the oxide superconductor film 14 is made of $YBa_2Cu_3O_{7-x}$ (also referred to as YBCO hereafter) for example, it offers high crystallinity. This oxide superconductor film 14 has a <001> direction of crystal grains, which is oriented substantially at right angles to the substrate 12's top surface, i.e., exhibits c-axis orientation. More precisely, the <001> direction may be arranged to cross the substrate surface at 90 plus/minus 4 (90±4) degrees, or more or less.

Note here that the oxide superconductor film 14 may be arranged so that about 90 percent (%) or more of its crystal grains is substantially perpendicular to the substrate surface. This orientation directionality of these crystal grains and the ratio of such almost perpendicularly oriented crystal grains to the whole crystal grains are calculable from x-ray diffraction (XRD) measurement values.

The oxide superconductor film 14 is arranged to have a low-angle grain boundary with specific orientation which causes the (100) planes of neighboring crystal grains to define therebetween an angle of from 0 to 4 degrees or 86 to 90 degrees. In other words, this film 14 is such that its crystal grains exhibit c-axis orientation with respect to the substrate while at the same time letting adjacent crystal grains be oriented so that a couple of a-axes or an a-axis and b-axis are almost at right angles to each other.

The oxide superconductor film 14 has a multilayered structure including two spaced-apart high-density magnetic field trap layers 14a and 14c, which are stacked over the substrate in almost parallel thereto, and a low-density magnetic field trap layer 14b, which is sandwiched between the high-density magnetic field trap layers 14a and 14c. The high-density magnetic field trap layer 14a, 14c is less than or equal to 80 nanometers (nm) in average grain boundary width in a horizontal cross-section relative to the substrate surface. This average grain boundary width is smaller than an average grain boundary width of the low-density magnetic field trap layer 14b in its cross-section horizontal to the substrate.

By specifically designing the high-density magnetic field trap layer 14a, 14c so that its average grain boundary width is less than or equal to 80 nm, the so-called pinning effect takes place appreciably. This grain boundary width is obtainable by evaluation of a transmission electron microscope (TEM) photograph at a cross-section of the oxide superconductor film 14 which is in parallel to the substrate 12. And, by averaging a plurality of grain boundary width values as measured from the TEM photograph, the average grain boundary width is obtainable.

The oxide superconductor 10 having the above-stated multilayer structure suppresses the lowering of the critical current density Jc owing to the presence of the high-density magnetic field trap layer 14a, 14c having the average grain boundary width of 80 nm or less. In addition, by the presence of the low-density magnetic field trap layer 14b, it is possible to well control the grain boundary width and the ratio of high-density magnetic field trap layer of the oxide superconductor film 14. With this control, it is possible to realize the oxide superconductor structure 10 which is lessened or minimized in occurrence of degradation of superconductivity properties even in the case of the film 14 being increased in thickness.

Note here that in a viewpoint of effective suppression of the property deterioration, it is preferable that the occupation ratio of the high-density magnetic field trap layers 14a and 14c in the oxide superconductor film 14 is specifically set to 60 volume percent (vol %) or greater.

Next, an explanation will be given of a method for fabricating the oxide superconductor structure 10 embodying the invention. In this fabrication method, what is done first is to prepare, as a coating solution, a fluoro-carboxylate-methanol solution with a mixture or blend of an at least one kind of metal and barium plus copper, which metal is selected from the group consisting essentially of yttrium and a group of lanthanoids, from which are excluded cerium, praseodymium, promethium and lutetium.

Then, this coating solution is coated on the substrate to thereby form a gel film. This gel film is then applied calcining process to form a calcined film—say, precursor film. Next, this calcined film is subjected to firing process and oxide annealing to thereby convert it to an oxide film. The firing process is the one that is designed to change in humidification amount a couple of times in such a way as to change its process condition from a higher humidification condition to a lower humidification condition and then again to the higher humidification condition during the thermal processing.

Figure 2:
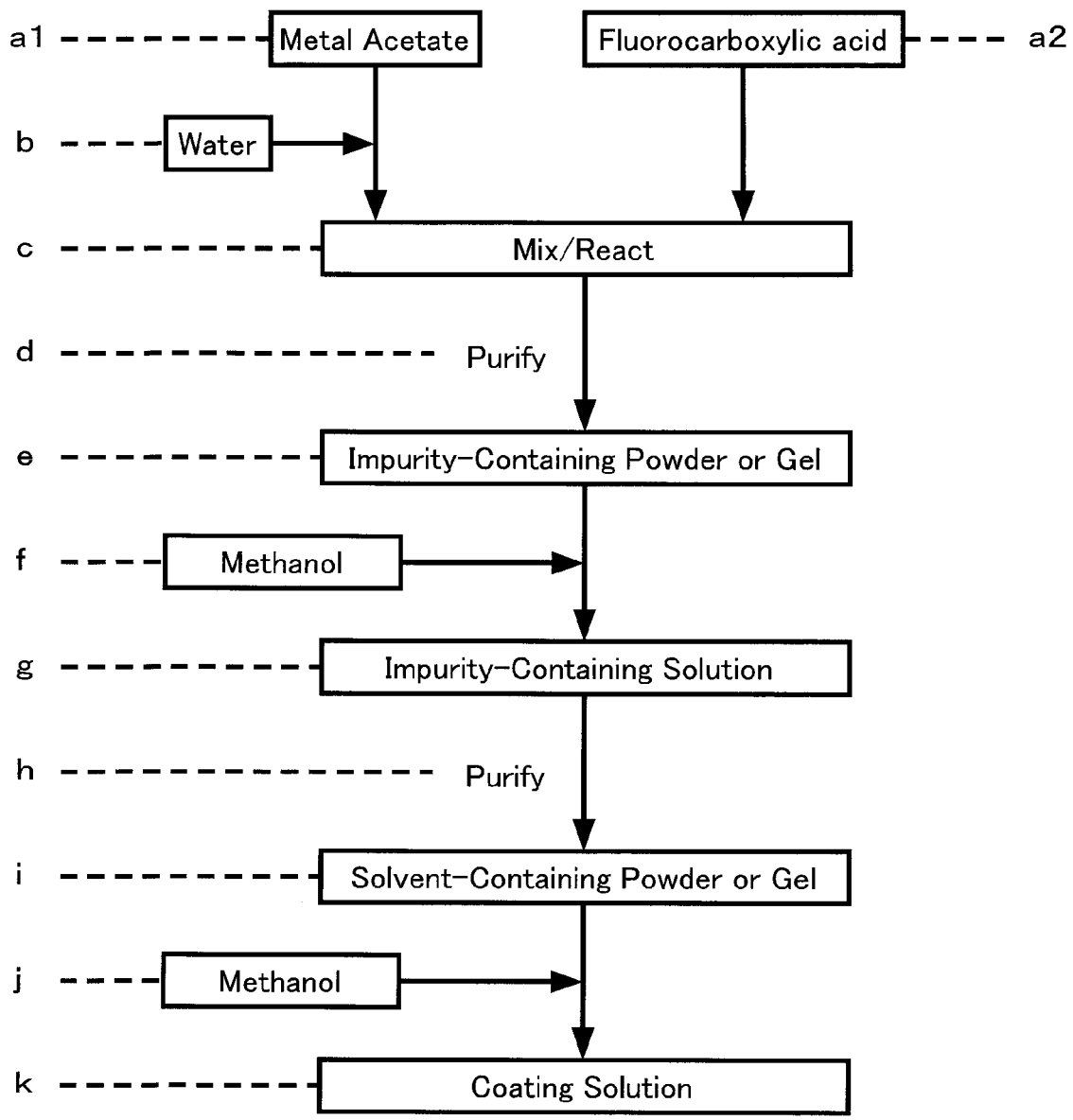
FIG. 2 is a flow chart of a coating solution adjustment process of the first embodiment.

FIG. 2 is a flow chart of a process for adjustment of the coating solution. Firstly, at step a1, a chemical compound such as metal acetate is prepared. Examples of it are acetic acid salts of yttrium, barium and copper. At step a2, a fluorocarboxylic acid is prepared. Next, at step b, the metal acetate that was prepared at the step a1 is dissolved in water; then, at step c, let it be blended and reacted with the fluorocarboxylic acid that was prepared at the step a2. At step d, the blended solution that was obtained at step c is purified, thereby obtaining an impurity-containing powder (sol) or gel at step e.

Thereafter, the sol or gel that was obtained at the step e is dissolved in methanol at step f, thereby making an impurity-containing solution at step g. Then, the solution that was obtained at the step g is purified to remove impurities at step h, thereby to obtain a solvent-containing powder (sol) or gel at step i. Further, the sol or get that was obtained at the step i is dissolved in methanol at step j so that the coating solution is prepared at step k.

Figure 3:
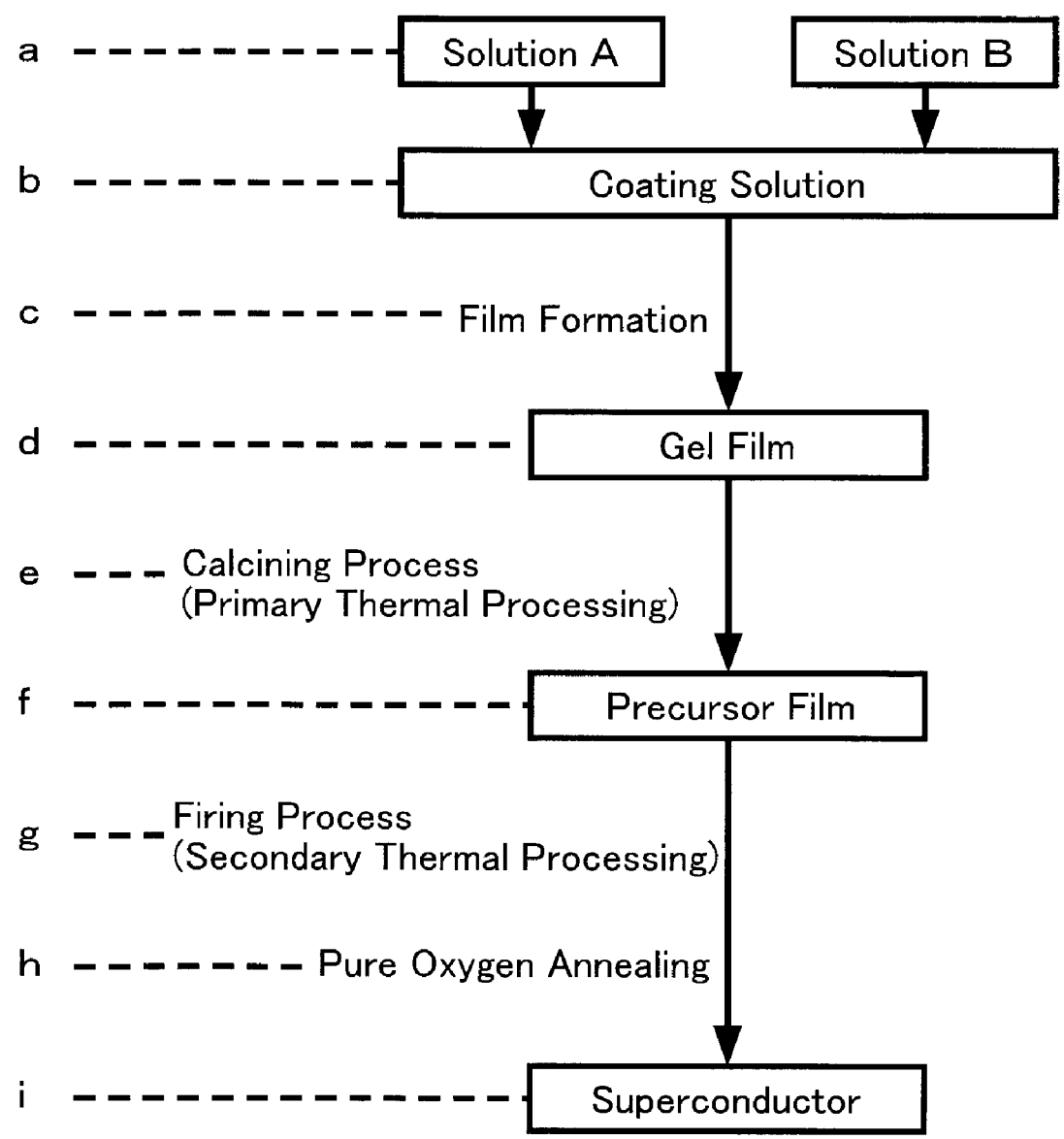
FIG. 3 is a flowchart of a process of forming a superconductor film from the coating solution of the first embodiment.

FIG. 3 is a flowchart of a process of forming a superconductor film using the coating solution. First, several different kinds of solutions—here, solutions A and B—are prepared at step a. Then, at step b, one solution is selected as the coating solution from the solutions A and B which were prepared at the step a.

Thereafter, at step c of FIG. 3, film formation is performed by coating the coating solution on the substrate by known spin coat techniques, for example; thus, a gel film is obtained at step d. Then, at step e, the gel film that was obtained at the step d is applied primary thermal processing, i.e., calcining process or "prefiring," for decomposition of organic matter so that a calcined film is obtained at step f. Next, this calcined film is further applied secondary thermal processing, i.e., firing process, at step g. Thereafter, pure oxygen annealing is applied thereto at step h, thus obtaining a superconductor at step i.

Figure 4:
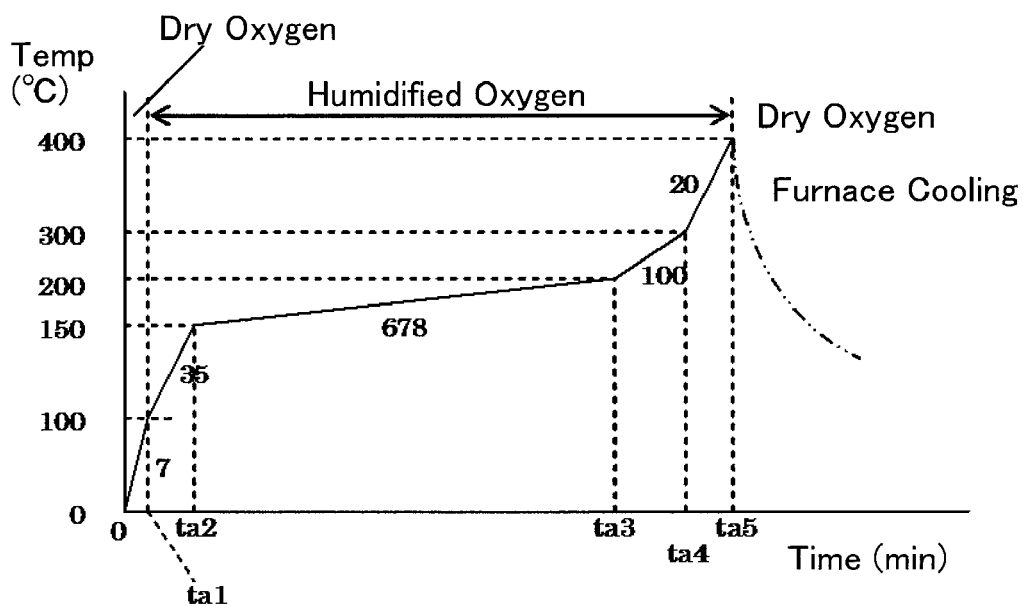
FIG. 4 is a graph showing one exemplary temperature profile of calcining process (primary thermal processing) of the first embodiment.
Figure 5:
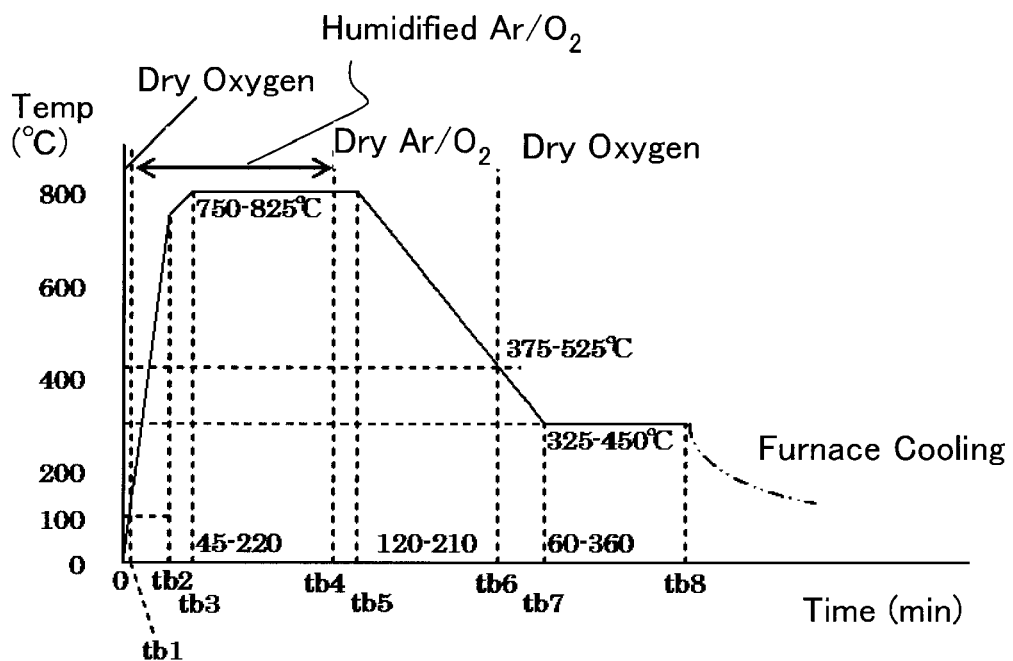
FIG. 5 is a graph showing an exemplary temperature profile of firing process (secondary thermal processing) of the first embodiment.

FIG. 4 is a diagram graphically showing one exemplary temperature profile of calcining process (primary thermal processing) whereas FIG. 5 is a graph showing an exemplary temperature profile of firing process (secondary thermal processing) and that of pure oxide annealing.

It should be noted that the oxide superconductor film which is formed by trifluoroacetate-used metal organic deposition (TFA-MOD) techniques contains therein carbon at $3 \times 10^{19}$ atoms per cubic centimeter (atoms/cc) or greater and fluorine at $5 \times 10^{17}$ atoms/cc or more.

In this embodiment, the firing process is performed while causing the humidification amount to vary a couple of times in such a way that it changes from a high humidification condition to a lower humidification condition and then to the high humidification condition. More specifically, as shown in the graph of FIG. 5, in a period between time points tb3 to tb4, the high-density magnetic field trap layer 14a shown in FIG. 1 is first formed under the high humidification condition. Then, this high humidification condition is changed to the low humidification condition to form the low-density magnetic field trap layer 14b that is wide in average grain boundary width. Next, the high-density magnetic field trap layer 14c that is narrow in average grain boundary width is formed by switching the low humidification condition to the high humidification condition.

In this way, by forming the low-density magnetic field trap layer 14b with wide average grain boundary width by changing the humidification condition before the disappearance of low-angle grain boundaries to be produced in the case of thick film fabrication becomes remarkable, it is possible to avoid degradation of superconductivity properties otherwise occurring due to the low-angle grain boundary disappearance.

More specifically, by providing the low-density magnetic field trap layer 14b, the film fabrication is reset, thus making it possible to narrow the average grain boundary width of the high-density magnetic field trap layer 14c to be formed thereon. Thus, the superconductor film becomes higher in low-angle grain boundary density, resulting in an increase in pinning center amount. Thus it is possible to avoid degradation of the superconductivity properties.

An explanation will next be given of effects and advantages of this embodiment. The superconducting film that was obtained by TFA-MOD method has its orientation texture in which rectangular crystal grain ensembles are coupled with each other in a cross-section which is cut along a plane extending in parallel to the substrate surface as demonstrated by a plan-view (plane) TEM image. The angle of direction of such coupled part is about 0.4 degrees in average at those portions overlying a single-crystalline substrate; at other portions above a tape having an intermediate layer with a metal base material as its base, the angle is two to ten times greater than this value in the present situation—that is, it ranges from about 0.8 to 4.0 degrees in average coupling or "bond" angle.

As far as the film fabrication is continued under the same condition, the above-noted grain boundaries decrease in number, resulting in degradation of superconducting properties due to reduction of the pinning center number. To avoid this problem, it is effective to use a technique for reproducing them after disappearance of low-angle grain boundaries.

The low-angle grain boundaries are typically created at parts at which a growing end portion collides with another growing end portion due to nucleus formation and growth of crystal grains. The nucleus formation and growth rate of such grains concerned are determinable by certain process parameters, such as a firing process temperature, firing process gas flow rate and humidification amount. The dependency of the growth speed upon the gas flow rate during the firing process is due to a growth mechanism unique to the TFA-MOD process and is because of the fact that $YBa_2Cu_3O_{7-x}$ grains are supplied by chemical equilibrium reaction which follows:

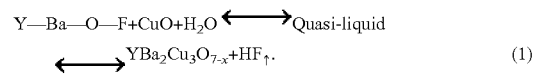

$$Y-Ba-O-F+CuO+H_2O \longleftrightarrow Quasi\text{-liquid}$$
$$\longleftrightarrow YBa_2Cu_3O_{7-x}+HF\uparrow. \qquad (1)$$

This reaction is chemical equilibrium reaction but is such that $YBa_2Cu_3O_{7-x}$ grains are formed without experiencing occurrence of any counterreaction when a hydrogen fluoride (HF) gas generated is removed into the gas phase. Note here that this chemical equilibrium is thought to be extremely biased toward the left side thereof, and it has been known among those skilled in the art that $YBa_2Cu_3O_{7-x}$ grains are transformed into a quasi-liquid when a less amount of HF gas is newly supplied.

Although this report is with the use of EB method, it is believed that similar reactions take place during firing process in the TFA-MOD method also. In the above-noted reaction formula (1), $YBa_2Cu_3O_{7-x}$ grains are created in proportion to the removing amount of HF gas so that the growth rate is determined by the gas flow rate during firing process, which is related to the removal speed.

In the reaction formula (1), the reaction of interest is also accelerated with an increase in amount of $H_2O$, which indicates the gas humidification amount during the firing process. Readily understandably, when causing the $H_2O$ amount to increase while setting the temperature to stay constant, the equilibrium moves to the right side and therefore there is an effect of causing the reaction rate to increase accordingly. As apparent from the foregoing discussion, major factors that affect the nucleus generation or "nucleation" and the growth rate of grains in TFA-MOD process are (A) firing process temperature, (B) gas flow rate during firing process, and (C) humidification amount.

Regarding these three major factors affecting the nucleus generation and growth rate of crystal grains or particles, it is considered that understanding and controlling these factors makes it expectable to provide an effective means for enabling reproduction of the low-angle grain boundary density even when this density decreases with an increase in film thickness. This may be effectively devoted to improvements in electrical characteristics of power transmission cables, which are to be used in environments under application of their own or "self" magnetic fields.

Figure 6:
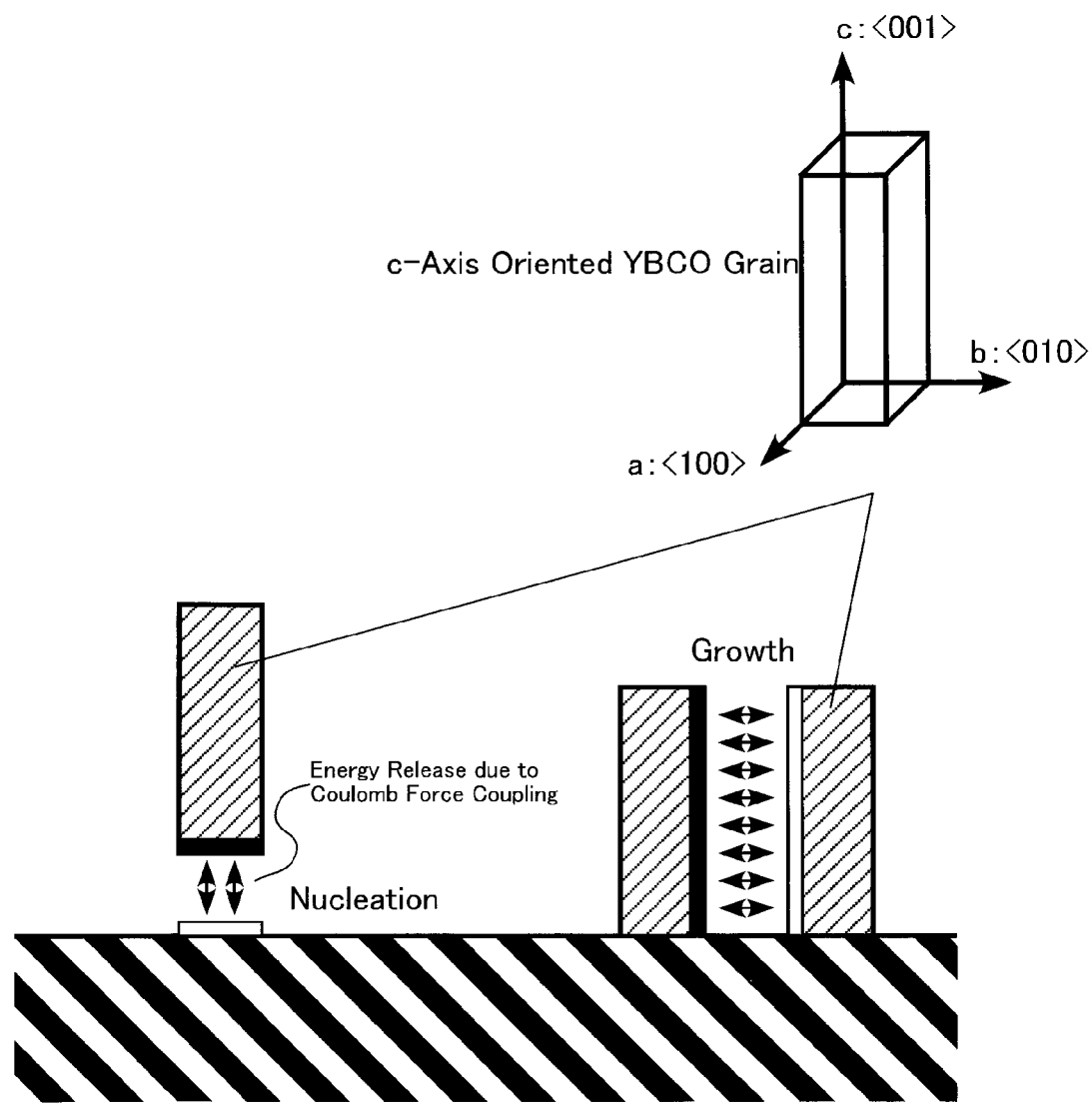
FIG. 6 is a pictorial representation for explanation of crystal grain nucleation and growth.

FIG. 6 is a pictorial representation for explanation of grain nucleus generation and growth. In the fabrication of $YBa_2Cu_3O_{7-x}$ film using TFA-MOD method, concerning the nucleus generation and growth of crystal grains, at least the grain growth is readily occurrable from a viewpoint of the energy. This can be said for the reason which follows.

As for the nucleus generation of c-axis oriented grains capable of flowing a superconduction current, i.e., supercurrent, in the horizontal direction relative to the substrate, it is necessary for occurrence of the intended nucleus generation to permit an a-b plane—or alternatively, a (001) plane—of $YBa_2Cu_3O_{7-x}$ grains in a quasi-liquid phase to be coupled or bonded with the substrate. It is very likely that this coupling forces an energy to be released toward outside of the system, resulting in establishment of stabilization which leads to the nucleus generation.

On the other hand, in the crystal grain growth, one to four couplings or "bonds" are formed in addition to the coupling with the ab crystal plane ((001) plane) to be formed during the nucleus generation—i.e., the bonds of ac plane ((010) plane) or bc plane ((100) plane) in the coupling with neighboring grains. Although each such coupling plane is about three times greater in area than the ab plane, energy release at the time of coupling is not simply proportional to the area of the coupling plane. However, it is understandable that in the case of virtually simple proportionality or similar ones, the grain growth takes place more readily than the nucleus generation. The same goes with the case of the presence of only one coupling plane.

In view of the above, it can be seen that when comparing an energy $E_N$ to be released during grain nucleus generation to an energy $E_G$ to be released during the growth of grains, $$E_N < E_G \quad (2a)$$

is realized under any possible conditions. It is at least understandable that the energy $E_N$ satisfies:

$$E_N < E_{G1} < E_{G2} < E_{G3} < E_{G4}, \quad (2b)$$

where $E_{G1}$ is an energy release amount in the case of coupling is performed at one crystal plane during grain growth, EG2 is an energy release amount in the case of coupling is done at two planes during grain growth, et seq.

Figure 7:
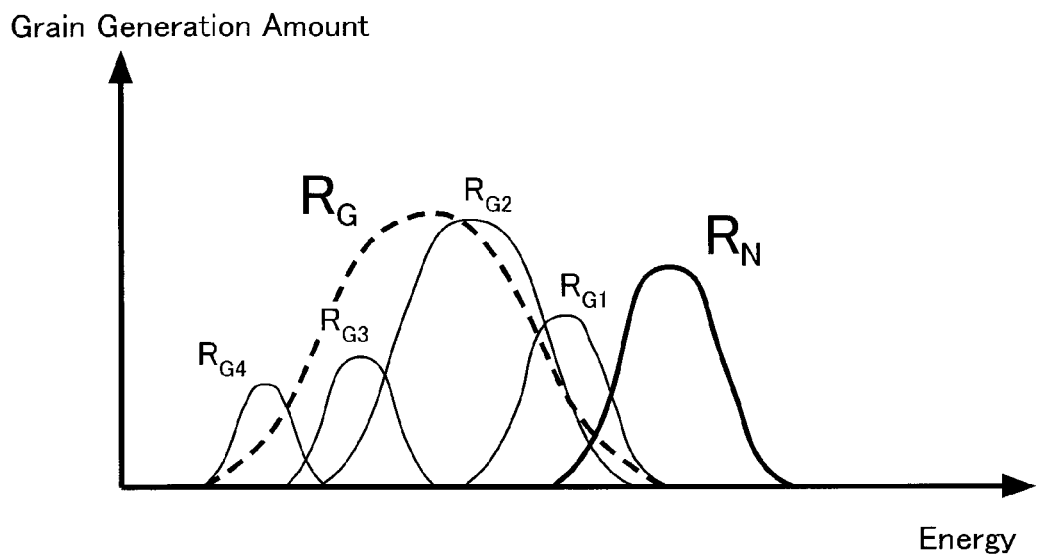
FIG. 7 is a graph showing a relationship of grain generation amount versus system energy during firing process.

FIG. 7 is a graph showing a relationship of grain generation amount versus system energy during the firing process. Nucleus generation $S_N$ and growth $S_{Gn}$ (where n is a positive integer) of those crystal grains which release the above-noted energies $E_N$ and $E_G$ are each considered to exhibit a monotone increase with respect to the energy of the system during the firing process. Accordingly, a frequency that is obtained by differentiation of it by the energy—that is, a grain production amount $R_N$, $R_{Gn}$ per unit time—is thought to be a function which is proximate to a normal distribution with each $E_N$, $E_{Gn}$ being as the center thereof. Standardized results of $R_N$ and $R_{Gn}$ are shown in FIG. 7, wherein respective ones are expected to be queued at equal intervals.

It is the all-grain growth frequency $R_G$ that affects the low-angle grain boundary width. Any one of $S_G$ and $R_G$ is written by a sum of products of probabilities of occurrence of each $S_{Gn}$ while letting a total probability $\Sigma P_{Gn}$ of $S_{Gn}$ occurrence be one (1). It is considered that each grain has four coupling planes, most of which are $R_{G2}$. Thus, it is thought that $R_G$ has a spread equivalent to a total sum of $R_{G1}$, $R_{G3}$ and $R_{G4}$ with $R_{G2}$ being as the center, which is indicated by dotted line in FIG. 7. $R_G$ exists certainly on a lower energy side than $R_N$ because $R_G$ is the sum of $R_{G1}$ to $R_{G4}$.

It is considered that a crystal grain boundary width W which is expected to improve the superconduction properties is variable depending upon the ratio of $S_N$, $S_G$ with $R_N$ and $R_{Gn}$ being integrated together. For this reason, $$W = (S_G, S_N) \quad (3a)$$

is given while letting each be a variable. However, by letting the above-stated ratio $S_G/(S_G+S_N)$ be regarded as a one variable, it is also possible to provide the following equation:

$$W = (S_G/(S_G+S_N)) = (r). \quad (3b)$$

Here, letting $r = S_G/(S_G+S_N)$, it is also possible to simply write it as the right-hand term of Equation (3b) above. The width W at a given energy $E_x$ becomes a function relying upon an integration value of $R_N$ and $R_{Gn}$ within a range of from zero up to $E_x$ as shown in FIG. 7. The more the nucleus generation $S_N$, the less the width W. The greater $S_G$, the larger the width W in value.

Figure 8:
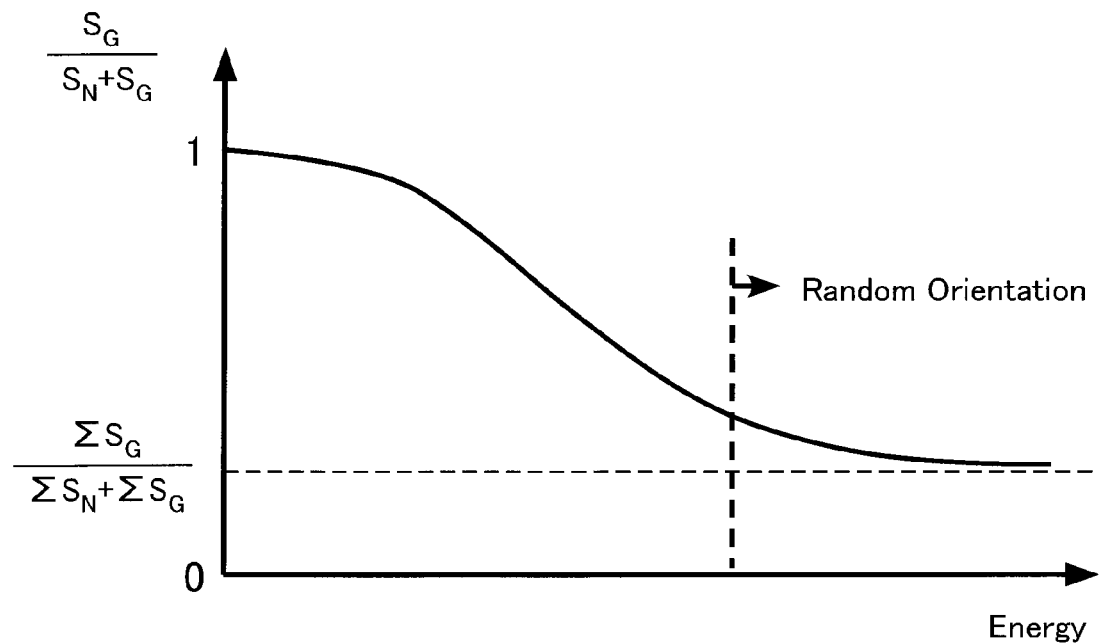
FIG. 8 is a graph showing a relation of grain growth probability versus system energy during firing process.

FIG. 8 is a graph showing a relation of grain growth probability versus system energy during firing process. Note here that "r" takes a value which is infinitely near to 1 when the energy is at zero as shown in FIG. 8, and becomes a function that simply decreases with an increase in energy. Also understandably, it is a function which takes a limit value of $\Sigma S_G/(\Sigma S_G + \Sigma S_N)$ when the energy is infinite.

However, in reality, it is predicted that there is no change for it to take the infinite value. The reason of this is as follows. Excessively increasing the energy causes the growth rate to increase, resulting in the equilibrium reaction of Equation (1) being collapse, which is predicted to lead to occurrence of random growth; thus, atom-level orientation is no longer obtainable, which is due to chemical equilibrium reaction that is a unique feature to the TFA-MOD method.

In order to obtain the intended high-property superconductor by changing the low-angle grain boundary width W, a means capable of varying the above-noted value r within a shorter length of time period may be used. It is noted that although $W = (r)$, W is considered to be a simple incremental function with respect to r because of the fact that as $S_N$ is larger, r becomes smaller and thus W becomes less in value.

Note however that it is predicted that the change of W is kept less at a portion at which the change amount of r is small; so, it is desirable to use a specific firing process condition that permits $S_G$ and $S_N$—in particular, $S_N$—to vary significantly in FIG. 7. In this respect, a value at or around the center value of $R_N$ is considered to be suitable therefor. It is considered that when causing the firing process condition to change significantly at that portion, r varies accordingly, thereby making it possible to change W significantly. With this arrangement, by letting it contain therein a great number of low-angle grain boundaries under conditions with the W value being entirely changed, it becomes possible to improve the superconduction properties.

As previously stated, the factors affecting this r value include (A) a firing process temperature, (B) gas flow rate during the firing process, and (C) humidification amount. There will next be described whether each of these factors is able to change r, i.e., the ratio $S_G/(S_G+S_N)$.

First of all, consideration is given to the factor (A) namely, the temperature changeability of a firing process furnace. It is not yet known that the chemical equilibrium constant indicated in Equation (1) changes to which side when the temperature is changed. In addition thereto, in a large-scaled electric furnace or oven system, it is almost impossible to rapidly change the temperature of its furnace structure. Under the condition that the firing process temperature varies slowly, the value r also changes gradually. It is thus considered that there is rarely found the effect of returning the value W to its original value from an increased state; even when such effect is available, it remains very less when compared to other means.

Next, consideration is given to the case of modifying the factor (B), i.e., humidified gas flow rate during the firing process. As increase of the humidified gas flow rate during firing process accelerates removal of HF gas that is a product in Equation (1); so, it leads to an increase in feed amount of $YBa_2Cu_3O_{7-x}$ grains in a way pursuant to such removal. This is equivalent to increases in $S_G$ and $S_N$. Thus it is expected to provide the effect of changing r, i.e., $S_G/(S_G+S_N)$.

However, attempts to change the ratio $S_G/(S_G+S_N)$ based on modification of the gas flow rate are often encountered with problems in the process of firing a width-increased extra-long wire material. In the TFA-MOD method, counter-reaction can occur even upon exposure to a gas which contains a less amount of HF. Due to this, gas flow irregularity and turbulent flow can take place, resulting in superconduction characteristics being appreciably lowered at such part, although the growth rate increases in accordance with the gas flow rate in a continuous furnace for firing wide wire materials by use of direct and alternate currents. Thus, it can also be said that the gas flow rate is a parameter which is relatively hard to change as far as the wire material firing process is concerned.

Another problem is that the gas flow rate during firing process is incapable of being changed significantly, with exception of the case of performing pressure reduction, because a laminar flow must be retained. Thus, the gas flow rate that can be increased is at a level of tenfold at most. It is cooldown or refrigeration of superconductor that seems to become the most serious problem in the case of the gas flow rate being increased. As the gas flow rate increases, the superconductor is cooled down, resulting in deviation from the optimum condition during the firing process. Thus, it becomes difficult to obtain the intended superconductor of good quality.

Additionally, in the case of increasing the gas flow rate, a need is felt to perform the firing process by use of a highly purified gas at a low oxygen partial pressure in a system including La, Nd or Sm-based superconductor, which is expected to achieve excellent characteristics among Y-based superconductors. For that purpose, gas circulation becomes necessary.

Lastly, regarding the factor (C), i.e., the humidification amount during the firing process, this is free from the limits as in the factors (A) and (B); thus, this factor is easy to change, which is considered to be an effective approach to fulfilling the humidification amount up to every detail within a short length of time period. With this approach, no temperature drop occurs as far as the gas flow rate is kept constant. In addition, by blending a dry gas into the gas of fixed humidification amount, it is possible to instantly realize a gas of extra-low humidification. Thus it becomes possible to switch from such state to a gas of increased humidification amount in a short period of time.

As apparent from the foregoing discussion, it is the humidification amount change that is able to vary the ratio $S_G/(S_G+S_N)$ most significantly in a short time. Consequently, according to the embodiment that is designed to change the humidification amount, even when the low-angle grain boundary width becomes greater at a constant film thickness, it is possible to return the low-angle grain boundary width to its original density by instantly modifying the humidification amount, thereby enabling improvement in superconduction properties under self magnetic fields.

Although in this embodiment one specific oxide that contains yttrium, barium and copper is exemplified for use as the oxide superconducting film, the oxide superconductor film should not be limited only to this composition and may alternatively be modified to use other possible oxides as far as these contain therein at least one kind of metal, barium and copper, wherein the metal is selected from the group consisting of yttrium and a group of lanthanoids with cerium, praseodymium, promethium and lutetium being excluded therefrom.

Also note that while in this embodiment the oxide superconductor film having the three-multilayered structure is provided which is manufactured by changing the humidification amount a couple of times in the process of the firing process, the humidification amount may alternatively be changed an increased number of times—for example, 2n times (where n is a positive integer more than or equal to 2) in a way that it changes from a high level to low level, then to high, then to low and then to high level (high→low→high→low→high). By changing it 2n times during the firing process, an oxide superconductor film is fabricated, which has a (2n+1) multi-layered structure consisting of (n+1) high-density magnetic field trap layers and n low-density magnetic field trap layers, each of which is sandwiched between adjacent ones of the high-density magnetic field trap layers.

The oxide superconductor structure having more than five stacked magnetic field trap layers is readily increasable in film thickness while at the same time retaining the pinning center at high density. Thus it is possible to flow a large current therein; simultaneously, it becomes possible to suppress superconduction property degradation otherwise occurring due to the creation of magnetic fields.

In the fabrication method of this embodiment, in order to significantly vary the $S_G/(S_G+S_N)$ value within a short length of time period, it is preferable that the maximum value of the humidification amount during firing process be more than three times greater than the minimum value thereof. More preferably, the former is at least ten times greater than the latter.

Additionally in the fabrication method of this embodiment, preferable settings are such that the high humidification condition is set to 1.26% in relative humidity (RH), and the film fabrication amount under this high humidification condition is 60 volume percent (vol %) or more of the total film fabrication amount. More specifically, the thermal processing, i.e., firing, is preferably performed under conditions which satisfy:

$$\Sigma R(t=0-\infty, RH \geq 0.0126)/\Sigma R(t=0-\infty, \text{total RH}) \geq 0.60, \quad (4)$$

where R is the reaction amount in superconductor film fabrication, v is the reaction rate, and t is the reaction time. Here, R=vt. As will be described later, with the setting of the reaction rate v is proportional to $(RH)^{0.340}$, let $v=k(RH)^{0.340}$, where k is a constant. By performing film fabrication under this condition, it becomes possible to effectively suppress deterioration of superconductivity properties.

More preferably, the high humidification condition is set to 1.26% RH or more, and the film fabrication amount under this humidification condition is 90 vol % or above of the total film fabrication amount under the high humidification condition. More precisely, the firing is performed under a condition which satisfies:

$$\Sigma R(t=0-\infty, RH \geq 0.0126)/\Sigma R(t=0-\infty, \text{total RH}) \geq 0.90. \quad (5)$$

By performing the film fabrication under this condition, it becomes possible to suppress or minimize the superconduction property deterioration more successfully.

As apparent from the foregoing, according to this embodiment, it is possible to provide an improved multilayer superconductor structure and its fabrication method capable of improving superconductivity properties by modifying the humidification amount—this is the firing process condition capable of rapidly varying the nucleus generation frequency and growth of crystal grains—and forcing the density of low-angle grain boundaries to return to its original value whenever this density is lowered. Unlike prior known magnetic field characteristics improvement techniques which introduce extra material, the superconductor structure of this embodiment is expected to guarantee that the superconductivity transition temperature Tc and critical current density Jc in the absence of magnetic fields are hardly lowered at all. Accordingly, this is an advantageous technique suitably employable for, especially, in superconductor cables which are under review for use in certain situations with the presence of self magnetic fields.

Second Embodiment

A fabrication method of an oxide superconductor structure in accordance with second embodiment of this invention is includes the steps of preparing as a coating solution a fluorocarboxylate-methanol solution with a mixture of barium and copper plus at least one metal which is selected from the group consisting of yttrium and lanthanoids with cerium, praseodymium, promethium and lutetium being excluded therefrom, laying the coating solution on a substrate to form a gel film, applying calcining process to the gel film to thereby form a calcined film, and applying to the calcined film firing process with more than two changes in gas flow rate during thermal processing and oxygen anneal to thereby convert the calcined film into an oxide film. This embodiment method is similar to the first embodiment with the humidification amount being replaced by the gas flow rate for being changed during the firing process.

As previously stated in conjunction with the first embodiment, it is most preferable to vary the humidification amount during firing process in order to largely change the ratio $S_G/(S_G+S_N)$ within a short length of time period. However, it is also possible to change the ratio $S_G/(S_G+S_N)$ by varying the gas flow rate, in place of the humidification amount. Therefore, with this fabrication method, it is possible to manufacture, by modification of the low-angle grain boundary width, the intended oxide superconductor composition or structure having an oxide superconducting film with a multilayer structure of high-density magnetic field trap layers and a low-density magnetic field trap layer sandwiched therebetween.

It is noted that in this embodiment, when the firing process is performed by using an apparatus capable of firing a target material under a reduced pressure or an increased pressure, a change in gas flow rate under such pressure application affects the growth of crystal grains or particles; so, $S_G/(S_G+S_N)$ is made changeable by changing the gas flow rate also. Even in the low-pressure or high-pressure state, the gas flow rate varies in a way proportional to the grain growing speed in the case of this reaction. In view of this fact, in the fabrication method of this embodiment, value settings are done in such a manner that the maximum value of such gas flow rate during firing process is more than three times greater than its minimum value in order to significantly change the $S_G/(S_G+S_N)$ value in a short length of time.

EXAMPLES

Practically implemented examples of this invention will be described below.

Preliminary Experiment 1

Firstly, experimentation was carried out to clarify the relationship of low-angle grain boundary width in oxide superconductor film versus superconductivity properties. Powders of hydrates of $Y(OCOCH_3)_3$, $Ba(OCOCH_3)_2$ and $Cu(OCOCH_3)_2$ were dissolved into ion-exchange water, respectively. Each was then mixed with a reaction-equivalent molar quantity of $CF_3COOH$, followed by stirring thereof. Then, these were blended together at a metal ion molar ratio of 1:2:3, thereby obtaining a mixed solution. This mixed solution was put into an eggplant-shaped flask for performing reaction and purification for twelve (12) hours at a reduced pressure in a rotary evaporator, thus obtaining a semitransparent blue-colored gel or sol.

The resultant gel or sol was added with methanol (at step "f" of FIG. 2) having its weight equivalent to a hundredfold increase of that of the gel or sol, for complete dissolution. This solution was again applied reaction and purification in the rotary evaporator at a low pressure for 12 hours whereby a translucent blue gel or sol was obtained. This gel or sol thus obtained was dissolved in methanol (step j of FIG. 2) and then subjected to dilution using a messflask. Thus obtained was a coating solution "A" of 1.52M in equivalent value of metal ion conversion.

Using the coating solution A, gel films G1a, G1b, G1c and G1d were obtained, each of which was formed on a double side polished 10-mm square orientation single-crystalline substrate made of $LaAlO_3$ by holding it on a spin coater at an acceleration of 10,000 rpm/sec and rotation number of 4,000 revolutions per minute (rpm) for 60 seconds. These gel films G1a-G1d were then stably situated within a calcining furnace for execution of thermal processing for organic material decomposition in a water vapor-filled environment in a way pursuant to the temperature profile shown in FIG. 4, thus obtaining translucent brownish-red calcined films, also known as calcined films, each of which is made of metal oxide fluoride. These films are labeled C1a, C1b, C1c and C1d, respectively.

Then, these calcined films C1a-C1d were subjected individually to firing process based on the main-bake profile shown in FIG. 5. This firing process was sequentially applied to the calcined films C1a-C1d while setting only the maximum temperature at 725° C., 750° C., 775° C. and 800° C. respectively and also forcing a before-and-after temperature ramp rate to be kept constant. Thus, superconductor films F1a, F1b, F1c and F1d were obtained.

The resulting films are subjected to measurement of superconduction properties using an inductive measurement apparatus—here, Cryoscan™ manufactured by THEVA GmbH—by derivation techniques under application of self magnetic fields in liquid nitrogen. While a reliable technique in relation to superconductor thickness measurement must be destructive analysis based on inductively coupled plasma (ICP) spectrometry, the presumed thickness using another corresponding specimen was used on this occasion in order to execute subsequent plane TEM observation. Low-angle grain boundary width measurement was performed by microstructure observation based on plane TEM observation.

Figure 9:
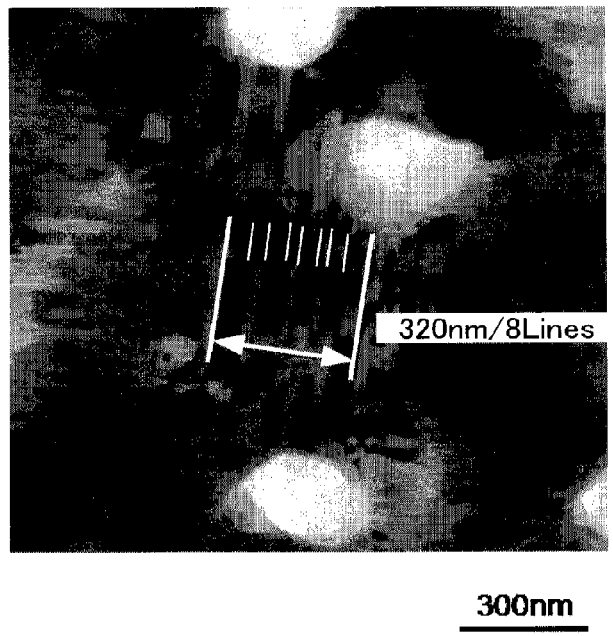
FIG. 9 is a macrophotograph indicating a plan-view transmission electron microscope (TEM) observation result of this embodiment.

A plane TEM observation result of the superconductor film F1d is photographically shown in FIG. 9. This photo was obtained by execution of plane TEM observation in a plane parallel to a substrate which has been moved from its surface by about 50 nm toward the film surface. In this TEM photo, a respective one having a rectangular shape with a width of about 40 nm and a length of about 500 nm is an ensemble of c-axis oriented crystal grains or particles. Although it is known that grown YBCO superconductor grains are readily mixable together as the a-axis length and b-axis length are almost the same value, it is considered that this rectangular region exhibits two-axis orientation with no such mixture therein.

This is also true for its neighboring rectangular region; however, this region is less than or equal to 0.4 degrees in coupling angle of plane direction at its neighboring part so that this region functions as a low-angle grain boundary and also serves as the pinning center which constraints magnetic fields. In light of the fact that the coupling angle is merely 0.4 degrees in average, it is considered that it rarely blocks the flow of a superconduction current, also called the supercurrent.

In FIG. 9, it is the low-angle grain boundary width that plays an important role for improvements of the superconduction properties. It is considered that if this is in a relatively dense state then excellent characteristics are attainable for application to electrical cables, which are readily influenceable by the presence of self magnetic fields. As a total value of grain boundary widths of eight rectangular regions is 320 nm in FIG. 9, it can be seen that the average grain boundary width is 40 nm. In a similar way, measurement of average grain boundary width values of the other superconductor films F1a, F1b and F1c was performed.

After completion of the firing process and prior to the plane TEM observation, respective films F1a to F1d were subject to the measurement of superconduction properties using Cryoscan™ available from THEVA GmbH by the derivation method under application of self magnetic fields in liquid nitrogen. These films' critical current density Jc values were measured to be 2.4, 2.9, 3.9 and 5.3 MA/cm$^2$, respectively. Their grain boundary widths were 190, 130, 80 and 40 nm, respectively.

Figure 10:
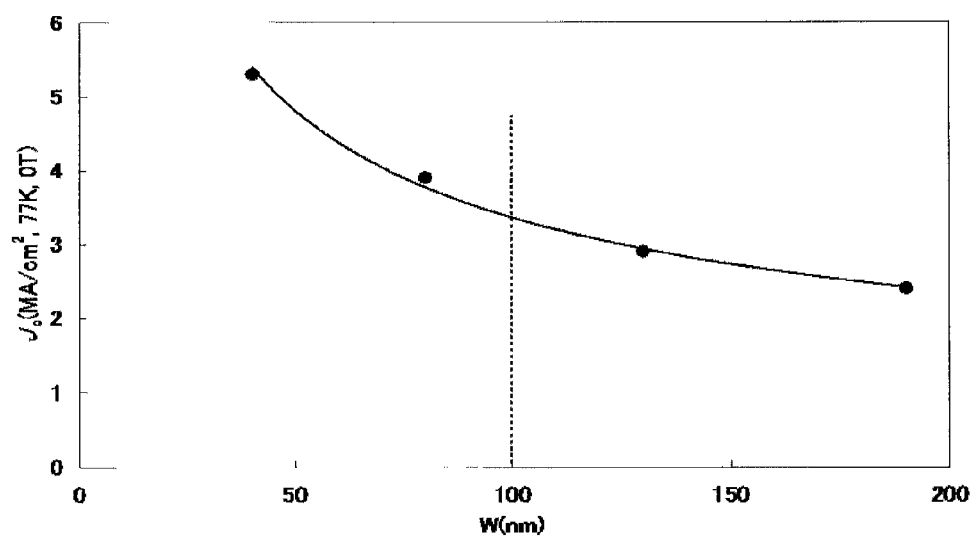
FIG. 10 is a graph showing a relation of critical current density versus low-oblique-angle grain boundary width of the embodiment.

An experimental result indicating the relation of the critical current density Jc versus low-angle grain boundary width W is shown in FIG. 10. It has been found that in comparison in the case of the same film thickness of 150 nm, improvement in characteristics of zero magnetic fields is expectable especially at part with its grain boundary width value being less than 10 nm. The film thickness is set at such fixed value of 150 nm in this measurement because the probability of formation of a/b-axis oriented crystal grains or particles increases with an increase in film thickness in cases where the monocrystalline substrate is made of LaAlO$_3$. In particular, in the fabrication of a film with its thickness greater than 220 nm on LaAlO$_3$ substrate, the influenceability of a/b-axis oriented grains increases so that it becomes impossible to evaluate the effect of the low-angle grain boundary width due to Jc measurement. For this reason, preliminary experimentation was carried out in fabrication of a film having a thickness of 150 nm, in which a/b-axis oriented grains are seldom or never formed.

Preliminary Experiment 2

During firing process, the humidification amount was changed for evaluation of a change in crystal grain growth. First, powders of hydrates of Y(OCOCH$_3$)$_3$, Ba(OCOCH$_3$)$_2$ and Cu(OCOCH$_3$)$_2$ were dissolved into ion-exchange water, respectively. Each was then mixed with a reaction-equivalent molar quantity of CF$_3$COOH, followed by stirring thereof. Then, these were blended together at a metal ion molar ratio of 1:2:3, thereby obtaining a mixed solution. This mixed solution obtained was put into an eggplant-like flask for performing reaction and purification for 12 hours at a reduced pressure in a rotary evaporator, thus obtaining a semitransparent blue-colored gel or sol.

The resultant gel or sol was added with methanol (at step f of FIG. 2) having its weight equivalent to a hundredfold increase of that of the gel or sol, for complete dissolution. This solution was again applied reaction and purification in the rotary evaporator at a low pressure for 12 hours whereby a translucent blue gel or sol was obtained. This gel or sol was dissolved in methanol (step j of FIG. 2) and then subjected to dilution using a messflask. Thus obtained was a coating solution A of 1.52M in equivalent value of metal ion conversion. A chosen additive was then added to this coating solution A by 10 weight percent (wt %) to thereby obtain a coating solution B. An example of the additive is H(CF$_2$)$_8$COOH.

Using the coating solution B, let a beaker with its volume of 100 cc be filled with this solution to a depth of about 30 mm. Then, a double face-polished 10×25 mm orientation LaAlO$_3$ single-crystalline substrate was put therein and kept untouched for about 60 seconds. Thereafter, a dip coater was used to pick it up at a withdrawal speed of 13 mm/sec to thereby form a couple of films G2a and G2b each having gel films formed on its both surfaces.

The gel films G2a-G2b were stably situated within a calcination furnace for performing thermal decomposition of organic material in a water vapor environment in a way pursuant to the temperature profile shown in FIG. 4, thereby obtaining translucent brownish-red calcined films C2a and C2b, which are made of metal oxi-fluorides. These calcined films are then individually subjected, one at a time, to firing process based on the temperature profile shown in FIG. 5. Firing process of the film C2a was performed while causing a gas to internally flow in a 58-mm diameter furnace core pipe at a flow rate of 1.0 liter per minute (L/min) whereas the film C2b's firing process was done by flowing the gas at a flow rate of 2.0 L/min. The maximum firing temperature was set at 825° C. for both.

In the firing process of each film, the humidification amount was set to 0.0420, 0.420, 1.26 and 4.20% RH. The reaction gas used was for collection trap of fluorides by 200 ml of trap water, and measurement of the fluorine ion density of such trap water was performed concurrently. By this firing process, superconductor films F2a and F2b were obtained.

Figure 11:
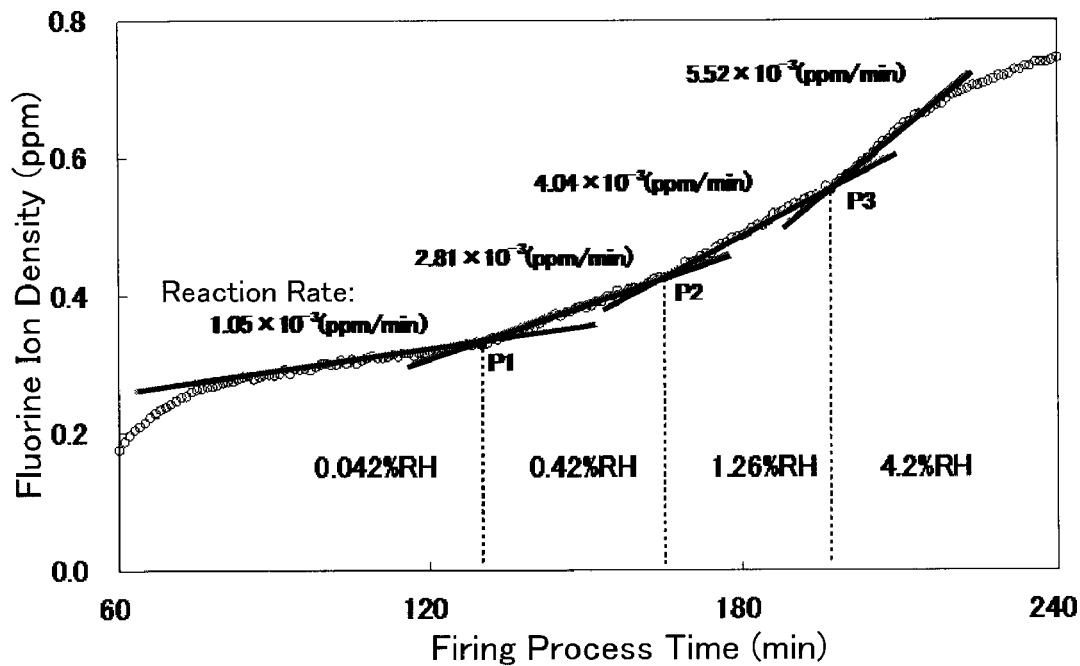
FIG. 11 is a graph showing a fluorine ion measurement result after completion of the firing process of this embodiment.

See FIG. 11, which graphically shows results of the fluorine ion measurement as concurrently performed during the firing process of superconductor film F2a. As previously stated, it is well known that the removal of fluorides is proportional to growth of YBCO superconductor grains in the TFA-MOD process. Thus, it can be considered that the fluoride amount to be measured by fluorine ion measurement is apparently proportional to a number of growing superconductor grains.

The measurement results of FIG. 11 demonstrate that the fluorine detection rate is rapidly varied, in a short length of time of about one minute, at points P1, P2 and P3 at which the humidification amount was changed. This means that in cases where the density of low-angle grain boundary width W decreases as the film grows, modification of the humidification amount is an effective means for increasing it again.

Figure 12:
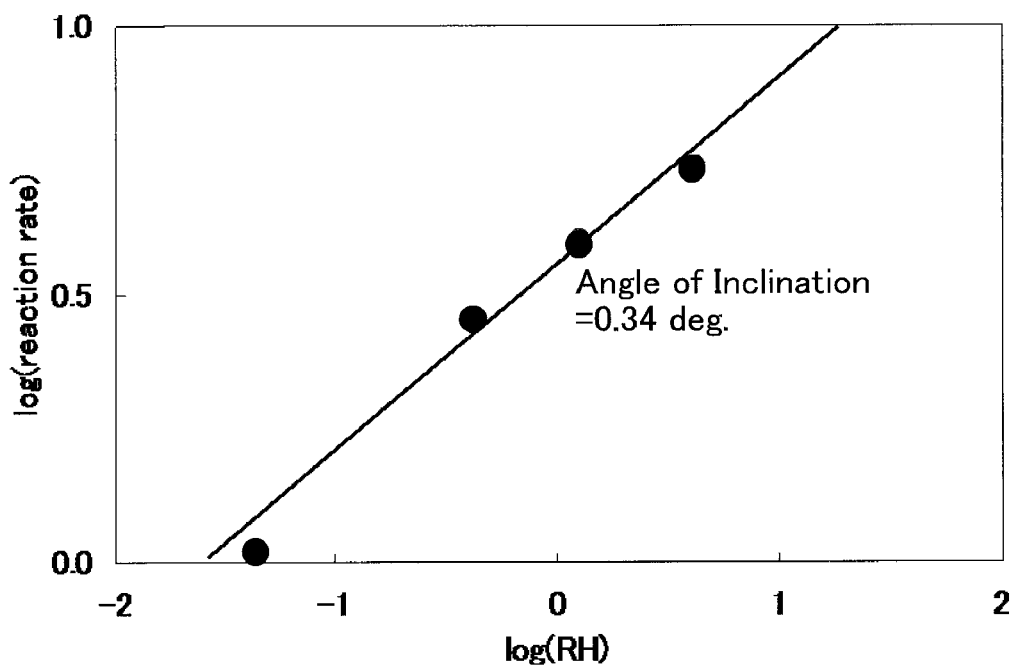
FIG. 12 is a graph showing a relation of fluorine ion detection rate versus humidification amount of the embodiment.
Figure 13A:
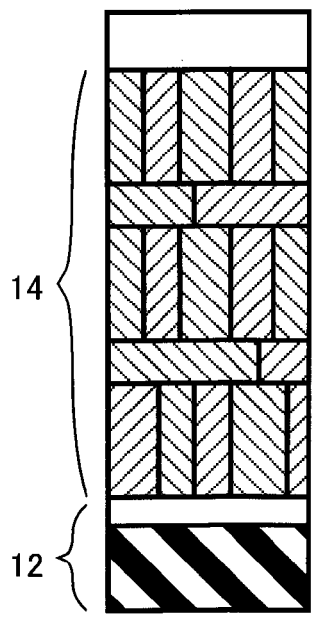
FIGS. 13A to 13D are diagrams each showing, in cross-section, a superconductor structure having a plurality of low-density magnetic field trap layer in accordance with the embodiment.
Figure 13B:
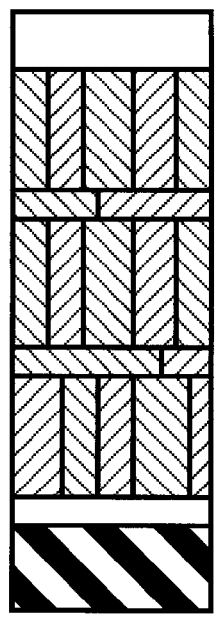
Figure 13C:
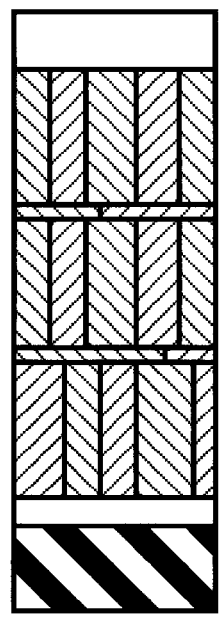
Figure 13D:
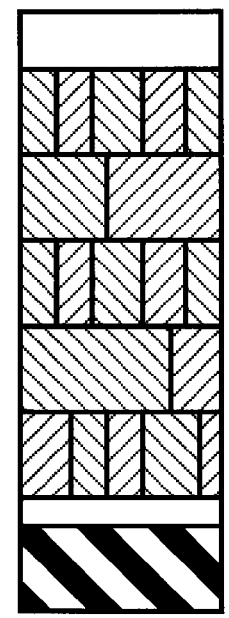

A relation of fluoride detection rate versus humidification amount in regard to the measurement results of FIG. 11 is shown in FIG. 12 in a double logarithmic graph form. From viewing this graph, it can be seen that the humidification amount and the fluoride detection rate are essentially in a 0.340-powered relationship. As the humidification amount is capable of instantly changing the mixture ration of a humidification gas and a dry gas by using a mass flow controller or else, it is easy to rapidly modify the humidification amount to a ten thousandfold decrease (1/10,000) or to a ten thousandfold (10,000) increase.

It is known from the result of FIG. 11 that the modification of the reaction rate due to changing of the humidification amount is completed within a very short length of time period—typically, one minute or shorter. Thus it is possible to change, within one minute or less, the reaction rate in TFA-MOD process to a 22.9-fold decrease (1/22.9) or 22.9-fold increase, by properly controlling the humidification amount.

Critical current density (Jc) measurement of the superconductor films F2a-F2b was performed using Cryoscan™ available from THEVA GmbH by derivation method under the application of a self magnetic field in liquid nitrogen, thereby to measure superconduction properties thereof. The film F2a's Jc values under the measurement condition of 77K and 0 T are as follows: 3.11 MA/cm$^2$ on its top surface, and 3.36 MA/cm$^2$ on its back surface. The film F2b's Jc values under the same measurement condition were found to be 3.84 MA/cm$^2$ on its top surface and 3.56 MA/cm$^2$ on its backface.

Experiment 1

A superconductor material was prepared by forcing, during firing process, the humidification amount to twice change from a high level to a low level and then to the high level; then, its superconduction properties were evaluated. Firstly, powders of hydrates of $Y(OCOCH_3)_3$, $Ba(OCOCH_3)_2$ and $Cu(OCOCH_3)_2$ were dissolved in ion-exchange water, respectively. Each was then mixed with a reaction-equivalent molar quantity of $CF_3COOH$, and then stirred. Next, these were blended together at a metal ion molar ratio of 1:2:3, thereby obtaining a mixed solution. This mixed solution was put into an eggplant-shaped flask for performing reaction and purification for 12 hours at a reduced pressure in the rotary evaporator. Thus a translucent blue-colored gel or sol was obtained.

The resultant gel or sol was added with methanol (at step f of FIG. 2) having its weight equivalent to a hundredfold increase of that of the gel or sol, for complete dissolution. This solution was again applied reaction and purification in the rotary evaporator at a low pressure for 12 hours whereby a translucent blue gel or sol was obtained. This gel or sol obtained was dissolved in methanol (step j in FIG. 2) and then subjected to dilution using a messflask. Thus obtained was a coating solution A of 1.52M in total metallic ion concentration.

A chosen additive, such as $H(CF_2)_8COOH$, was added to the coating solution A by 10 wt % to thereby obtain a coating solution B. Using this coating solution B, let a beaker of 100 cc be filled with this solution to a depth of about 30 mm. Then, a double face-polished 10×25 mm orientation $LaAlO_3$ monocrystal substrate was put therein and kept untouched for about 60 seconds. Thereafter, the dip coater was used to pick it up at a withdrawal speed of 20 mm/sec to thereby form a couple of films G3a and G3b each having gel films formed on its opposite surfaces.

The gel films G3a-G3b were stably placed within the calcining furnace for performing thermal decomposition of organic material in a water vapor environment in a way pursuant to the temperature profile shown in FIG. 6, thereby obtaining translucent brownish-red calcined films C3a and C3b, which are made of metal oxide fluorides. These calcined films are then individually subjected, one at a time, to firing process based on the temperature profile shown in FIG. 4. Firing process of each of the films C3a-C3b was performed while flowing a gas into the 58-mm diameter furnace quartz tube at a flow rate of 1.0 L/min. The maximum firing temperature was set at 825° C. for both, which was retained for one hour.

In the one-hour maximum temperature hold period, firing process of the film C3a was performed while changing at time intervals of 20 minutes the humidification amount from 4.20% RH to 0.0420% RH and then again to 4.20% RH, followed by execution of oxygen anneal. Thus a superconductor film F3a was obtained. Regarding the film C3b, its firing process was done while introducing the humidification amount to a fixed value of 4.20% RH so that a superconductor film F3b was obtained. It is considered that in the firing process of film F3a, the modification of humidification amount causes the ratio $S_G/(S_G+S_N)$ to be set at an extremely different value(s) even when the low-angle grain boundary density is decreased, thereby making it possible to recover the low-angle grain boundary density to its initial state.

Critical current density (Jc) measurement of the superconductor films F3a-F3b with respect to their top surfaces only was performed using the tool of THEVA Cryoscan™ by derivation method under application of self magnetic fields in liquid nitrogen, thereby to measure superconduction properties thereof. The film F3a's Jc values on its top surface under the measurement condition of 77K and 0 T was found to be 2.72 MA/cm$^2$ whereas the film F3b's Jc value on its top surface under the same measurement condition was 1.89 MA/cm$^2$. It is the problem unique to the top surface of $LaAlO_3$ substrate that the Jc value becomes smaller than the film thickness value of 150 nm. Conceivably, this is because a/b-axis oriented crystal grains or particles are formed.

This experimental result reveals that the film F3a is evidently high in superconduction properties, which in turn encourages us to believe that rapid changes of the humidification amount are appreciably effective in recovery or "reproduction" of the low-angle grain boundary width density. A cross-section TEM photograph image of the superconductor film F3a thus obtained suggests that this film has the multilayer structure as shown in FIG. 1, which is thought to have its improved properties owing to such reproduction of the low-angle grain boundary density. Note that the thickness of a baked film obtainable under this condition is 560 nm in average; so, this value was used to perform the Jc value calculation in this measurement session also.

Experiment 2

In the process of firing process, a superconductor was fabricated while twice changing the gas flow rate from a high level to a low level and then to the high level; next, its superconduction properties were evaluated. First, powders of hydrates of $Y(OCOCH_3)_3$, $Ba(OCOCH_3)_2$ and $Cu(OCOCH_3)_2$ were dissolved in ion-exchange water, respectively. Each was mixed with a equivalent molar quantity of $CF_3COOH$ and then stirred. Then, these were mixed together at a metal ion molar ratio of 1:2:3, thereby obtaining a mixed solution. This mixed solution obtained was put into an eggplant-shaped flask for performing reaction and purification for 12 hours under a reduced pressure in rotary evaporator system. Thus a semitransparent blue gel or sol was obtained.

The resultant gel or sol was added with methanol (at step f of FIG. 2) having its weight equivalent to a hundredfold amount of that of the gel or sol, for complete dissolution. This solution was again purified in the rotary evaporator under a reduced pressure for 12 hours whereby a translucent blue gel or sol was obtained. This gel or sol was dissolved in methanol (step j of FIG. 2) and then subjected to dilution using a messflask. Thus obtained was a coating solution A of 1.52M in equivalent value of metal ion conversion.

A chosen additive, e.g., $H(CF_2)_8COOH$, was added to the coating solution A by 10 wt % to thereby obtain a coating solution B. Using this coating solution B, let a beaker of 100 cc be filled with this solution to a depth of about 30 mm. Then, a double face-polished 10×25 mm orientation $LaAlO_3$ single-crystal substrate was put thereinto and kept untouched for about 60 seconds. Thereafter, the dip coater was used to pick it up at a raising speed of 20 mm/sec to thereby form three separate films G4a, G4b and G4c, each of which has gel films formed on its opposite surfaces.

The individual one of the gel films G4a-G4c was stably set into the calcination furnace for applying thereto thermal decomposition of organic material in a humidified atmosphere in a way pursuant to the temperature profile shown in FIG. 4, thereby obtaining translucent brownish-red calcined films C4a, C4b and C4c, which are made of metal oxide fluorides. These calcined films are then individually subjected, one at a time, to firing process based on the temperature profile shown in FIG. 5. Firing process of every film was performed at a maximal firing temperature of 825° C. for one hour under 4.20% RH humidified atmosphere for each film.

The gas flow rate during the firing process within the furnace quartz tube having its diameter of 58 mm was set to 1.0 L/min for the film sample C4a throughout the entire period of one hour. For the film C4b, the gas flow rate during firing process was twice changed at time intervals of 20 minutes in such a way that it is initially set at 1.0 L/min and then changed to 0.3 L/min and next returned to 1.0 L/min. For the film C4c, the gas flow rate during firing was twice changed from 3.0 to 1.0 and then to 3.0 L/min. After completion of oxygen annealing, superconductor films F4a, F4b and F4c were obtained. The gas flow rate control was performed using a mass flow controller. The gas flow rate was controlled here to change within the specific range of from 0.3 to 3.0 L/min. The reason of this is as follows. The nominal allowable error of the gas flow rate has routinely been set at 2% of a full scale so that it is impossible to vary the rate value extremely beyond this range.

Critical current density (Jc) measurement of the superconductor films F4a-F4c with respect to their top surfaces only was performed using THEVA Cryoscan™ by derivation method under application of self magnetic fields in liquid nitrogen, thereby to measure superconduction properties thereof. The film F4a's Jc values on its top surface at 77K and 0 T was found to be 1.86 $MA/cm^2$. The film F4b's Jc value on its top surface under the same measurement condition was 2.26 $MA/cm^2$. The film F4c's Jc value was 2.55 $MA/cm^2$.

From these results, it has been found that the use of the technique for varying the gas flow rate value to a threefold decrease (⅓) or a threefold increase is also effective in recovery or "reproduction" of the low-angle grain boundary density. Note however that the property improvement achieved by increase of the gas flow rate was clearly greater than that obtainable by reduction of the gas flow rate. Also note that the thickness of a baked or "calcined" film obtainable under this condition is 560 nm in average; so, this value was used for calculation of the Jc value in this measurement session also.

Experiment 3

During firing process, a superconductor having a varied ratio of its high-density magnetic field trap layers to the entirety with a time of each condition being as a parameter was fabricated while changing the gas flow rate four times from a high level to a low level and then to the high level and then to the low level and finally to the high level (high→low→high→low→high); then, its superconduction properties were evaluated. First, powders of hydrates of $Y(OCOCH_3)_3$, $Ba(OCOCH_3)_2$ and $Cu(OCOCH_3)_2$ were dissolved into ion-exchange water, respectively. Each was then mixed with a reaction-equivalent molar quantity of $CF_3COOH$, followed by stirring thereof. Then, these were mixed together at a metal ion molar ratio of 1:2:3, thereby obtaining a mixed solution. This mixed solution was put into an eggplant-shaped flask for performing reaction and purification for 12 hours under a reduced pressure in rotary evaporator, thus obtaining a semitransparent blue gel or sol.

The resultant gel or sol was added with methanol (at step f of FIG. 2) having a weight equivalent to a hundredfold amount of that of the gel or sol, for complete dissolution. This solution was again purified in the rotary evaporator under a reduced pressure for 12 hours whereby a translucent blue gel or sol was obtained. This gel or sol was dissolved in methanol (step j of FIG. 2) and then subjected to dilution using a messflask. Thus obtained was a coating solution A of 1.52M in metallic content.

An additive of $H(CF_2)_8COOH$ was added to the coating solution A by 10 wt % to thereby obtain a coating solution B. Using this coating solution B, let a beaker of 100 cc be filled with this solution to a depth of about 30 mm. Then, a double face-polished 10×25 mm orientation $LaAlO_3$ monocrystal substrate was put thereinto and kept untouched for about 60 seconds. Thereafter, the dip coater was used to pick it up at a raising speed of 20 mm/sec to thereby form five films G5a, G5b, G5c, G5d and G5e, each of which has gel films formed on its opposite surfaces.

The individual one of the gel films G5a-G5e was stably placed within the calcination furnace for applying thereto thermal decomposition of organic material in a water vapor environment in a way pursuant to the temperature profile shown in FIG. 4, thereby obtaining translucent brownish-red calcined films C5a, C5b, C5c, C5d and C5e, which are made of metal oxide fluorides. These calcined films are then individually subjected, one at a time, to firing process based on the temperature profile shown in FIG. 5. These films C5a-C5e were obtained through firing at the gas flow rate of 1.0 L/min while letting a chosen gas flow into the interior of 58 mm-diameter quartz tube furnace. The maximum firing temperature was set to 825° C. for each. For the films C5a-C5d, these were held in this condition for one hour. For film C5e which is less in grow rate, the hold time was extended by 50 minutes for completion of the firing process thereof. The firing process of film C5a was performed while setting the humidification amount to a fixed value of 4.20% RH within the maximum temperature hold time period of one hour.

Firing process of film samples C5b-C5d was performed by varying the humidification amount four times in such a way as to have values of 4.20, 0.0420, 4.20, 0.0420 and 4.20% RH in this order of sequence while letting a total time length be fixed to 60 minutes. For the film C5b, each value-holding time was set at 12 minutes. For the film C5c, this time length was sequentially set to 14→8→15→8→15 minutes. For the film C5d, it was set to 17→4→17→4→18 minutes in sequence. Regarding the film C5e, its firing process was done while changing the humidification amount four times from 4.20 to 0.0420 then to 4.20 then to 0.0420 and finally to 4.20% RH, with the hold time length being sequentially set at 10→40→10→40→10 minutes therefor. After having applied oxygen anneal to these samples, superconductor films F5a, F5b, F5c, F5d and F5e were obtained.

Critical current density (Jc) measurement of the superconductor films F5a-F5e with respect to their top surfaces only was performed using THEVA Cryoscan™ by derivation method under application of self magnetic fields in liquid nitrogen, thereby to measure superconduction properties thereof. The film F5a's Jc value on its top surface under the measurement condition of 77K and 0 T was found to be 1.86 MA/cm². The film F5b's Jc value on its top surface under the same measurement condition was 2.69 MA/cm².

The film F5c's Jc value was 2.93 MA/cm². Jc values of the films F5d and F5e were 3.06 and 2.06 MA/cm², respectively. As it is known that the thickness of a fired film obtainable under this condition is 560 nm in average, this value was used to calculate the Jc value in this measurement also.

Figure 14:
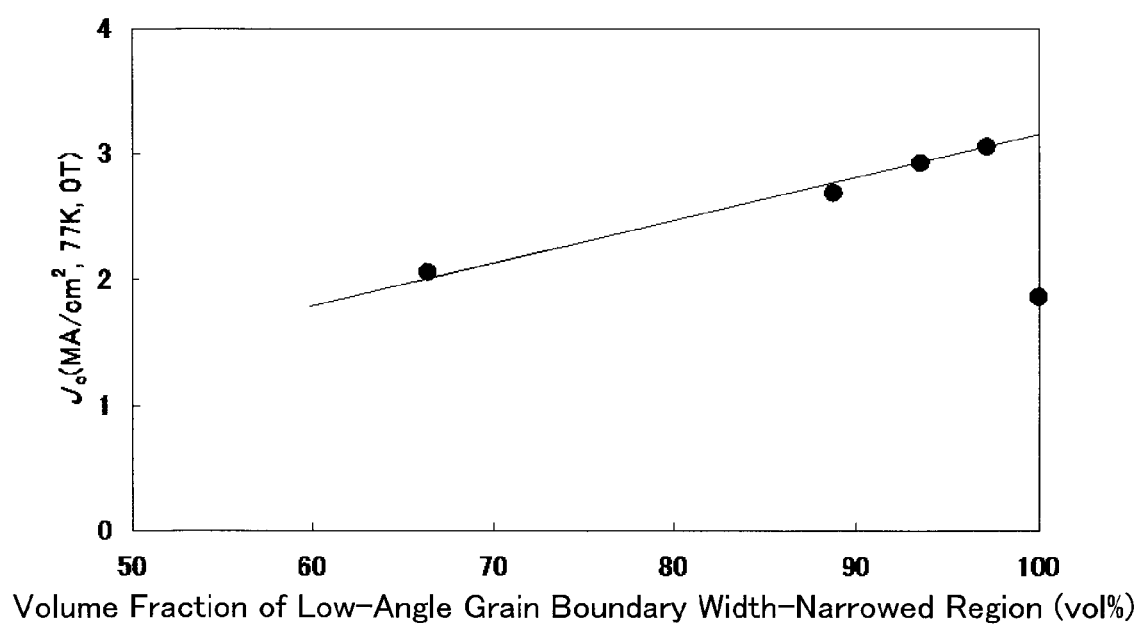
FIG. 14 is a graph showing a relation of critical current density versus volume fraction of a region with narrow low-angle grain boundary width in the embodiment structure.

Referring to FIGS. 13A to 13D, there are shown some typical cross-sectional structures of superconductor wires, each of which is obtainable by this experimentation to have a multilayered structure including a plurality of low-density magnetic field trap layers. The above-noted films F5b to F5e obtained here are considered, by observation of their cross-section TEM photo images, to have the multilayer structures shown in FIGS. 13A-13D, respectively. See next FIG. 14, which is a graph showing a relation of critical current density Jc versus volume fraction of low-angle grain boundary width-narrowed region (i.e., high-density magnetic field trap layer). It is considered that the superconductor film F5d is high in properties because the layer (low-density magnetic field trap layer) with its low-angle grain boundary width W widened by low humidification is lessened in volume. It is very likely that the Jc value under self magnetic fields is improved in cases where the volume of W-narrowed part (high-density magnetic field trap layer) exceeds 60% in ratio.

From the results, it was found that the superconductor properties are improved more significantly with an increase in number of growth rate-increased regions, i.e., low-angle grain boundary width-narrowed regions. It can also be revealed that enhanced properties are obtainable by use of the process of performing firing process in a specific way that such grain boundary width-narrowed regions become 60 vol % or more while simultaneously setting specific conditions for periodically recovering or "reproducing" the gas flow rate during the firing process.

In this way, the effects and advantages of this invention have been affirmed by the embodiments stated supra.

Although the invention has been disclosed and illustrated with reference to particular embodiments, the principles involved are susceptible for use in numerous other embodiments, modifications and alterations which will be apparent to persons skilled in the art to which the invention pertains. The invention is, therefore, to be limited only as indicated by the scope of the appended claims, with possible equivalents involved therein.

What is claimed is:

1. An oxide superconductor comprising:
   a substrate; and
   an oxide superconductor film formed on the substrate to have high crystallinity with a <001> direction of crystal grains being oriented substantially perpendicularly to the substrate and with (100) planes of neighboring ones of the crystal grains being oriented to form therebetween an oblique angle ranging from zero to four degrees or ranging from eighty-six to ninety degrees, wherein
   the oxide superconductor film has a multilayer structure made up of a plurality of high-density magnetic field trap layers stacked in almost parallel to the substrate and a low-density magnetic field trap layer interposed between adjacent ones of the high-density magnetic field trap layers, and wherein
   an average grain boundary width of the high-density magnetic field trap layers in a cross-section horizontal to the substrate is less than or equal to eighty nanometers and the average grain boundary width is less than an average grain boundary width of the low-density magnetic field trap layer in its cross-section horizontal to the substrate.

2. The oxide superconductor according to claim 1, wherein an occupation ratio of the high-density magnetic field trap layers in the oxide superconductor film is greater than or equal to sixty volume percent (vol %).

3. The oxide superconductor according to claim 1, wherein the oxide superconductor film is made of an oxide containing therein at least one kind of metal, barium and copper, and wherein the metal is selected from the group consisting of yttrium and lanthanoids with cerium, praseodymium, promethium and lutetium being excluded therefrom.

4. The oxide superconductor according to claim 2, wherein the oxide superconductor film is made of an oxide containing therein at least one kind of metal, barium and copper, and wherein the metal is selected from the group consisting of yttrium and lanthanoids with cerium, praseodymium, promethium and lutetium being excluded therefrom.

5. The oxide superconductor according to claim 1, wherein the oxide superconductor film contains carbon at $3 \times 10^{19}$ atoms per cubic centimeter (atoms/cc) or greater and fluorine at $5 \times 10^{17}$ atoms/cc or more.

6. The oxide superconductor according to claim 1, wherein the substrate is structured from a metal base and an oxide orientation intermediate layer on the metal base, and wherein the oxide orientation intermediate layer is made of at least one kind of oxide as selected from the group consisting of $LaAlO_3$, $NdGaO_3$, $Al_2O_3$, $SrTiO_3$, $CeO_2$, Y-enriched $ZrO_2$, $Y_2O_3$, $Gd_2Zr_2O_7$, $BaZrO_3$ and $BaZnO_3$.

7. The oxide superconductor according to claim 6, wherein the metal base is made of any one of Ni—Co—Cr and Ni—W alloys.

* * * * *